(12) United States Patent
Noguchi et al.

(10) Patent No.: US 9,754,664 B2
(45) Date of Patent: Sep. 5, 2017

(54) SEMICONDUCTOR MEMORY

(71) Applicant: Kabushiki Kaisha Toshiba, Minato-ku (JP)

(72) Inventors: Hiroki Noguchi, Yokohama (JP); Shinobu Fujita, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/070,685

(22) Filed: Mar. 15, 2016

(65) Prior Publication Data

US 2016/0196873 A1 Jul. 7, 2016

Related U.S. Application Data

(63) Continuation of application No. PCT/JP2014/074478, filed on Sep. 17, 2014.

(30) Foreign Application Priority Data

Mar. 20, 2014 (JP) ................................. 2014-058771

(51) Int. Cl.
    *G11C 11/00* (2006.01)
    *G11C 13/00* (2006.01)
    (Continued)

(52) U.S. Cl.
    CPC .......... *G11C 13/0002* (2013.01); *G11C 7/065* (2013.01); *G11C 7/18* (2013.01);
    (Continued)

(58) Field of Classification Search
    CPC ....... G11C 13/0002; G11C 7/065; G11C 7/18; G11C 11/161; G11C 11/1653; G11C 11/1655; G11C 11/1673
    (Continued)

(56) References Cited

U.S. PATENT DOCUMENTS 5,257,235 A * 10/1993 Miyamoto ........... G11C 7/1006
                                                      365/189.05
5,457,647 A    10/1995 McClure
                        (Continued)

FOREIGN PATENT DOCUMENTS

EP    0 622 801 A2    11/1994
EP    0 622 801 A3    11/1994
(Continued)

OTHER PUBLICATIONS

International Search Report issued Nov. 25, 2014 in PCT/JP2014/074478, filed Sep. 17, 2014 (with English Translation).
(Continued)

*Primary Examiner* — Pho M Luu
(74) *Attorney, Agent, or Firm* — Oblon, McClelland, Maier & Neustadt, L.L.P.

(57) ABSTRACT

A semiconductor memory includes a first block array including first to n-th blocks (n is a natural number of 2 or more) arranged in a first direction, each of the first to n-th blocks including a first memory cell, a first conductive line extending in the first direction, and shared by the first to n-th blocks, first to n-th current amplifiers corresponding to the first to n-th blocks, the i-th current amplifier (i is one of 1 to n) including an input terminal and an output terminal, the input terminal of the i-th current amplifier being electrically connected to the first memory cell in the i-th block, the output terminal of the i-th current amplifier being electrically connected to the first conductive line, and a sense amplifier electrically connected to the first conductive line.

16 Claims, 33 Drawing Sheets

(51) Int. Cl.
*G11C 7/18* (2006.01)
*G11C 11/16* (2006.01)
*G11C 11/419* (2006.01)
*G11C 7/06* (2006.01)
*G11C 7/10* (2006.01)

(52) U.S. Cl.
CPC ........ *G11C 11/161* (2013.01); *G11C 11/1653* (2013.01); *G11C 11/1655* (2013.01); *G11C 11/1673* (2013.01); *G11C 11/419* (2013.01); *G11C 13/004* (2013.01); *G11C 13/0023* (2013.01); *G11C 13/0026* (2013.01); *G11C 7/1048* (2013.01); *G11C 2207/005* (2013.01)

(58) Field of Classification Search
USPC ........................................................ 365/148
See application file for complete search history.

(56) References Cited

U.S. PATENT DOCUMENTS

| | | | |
|---|---|---|---|
| 5,963,473 A * | 10/1999 | Norman | G06F 11/1068 365/185.02 |
| 5,986,914 A | 11/1999 | McClure | |
| 6,205,073 B1 | 3/2001 | Naji | |
| 7,313,027 B2 * | 12/2007 | Hosono | G11C 16/12 365/185.18 |
| 8,014,221 B2 * | 9/2011 | Lee | G11C 7/065 365/207 |
| 8,451,680 B2 * | 5/2013 | Shim | G11C 11/4094 365/190 |
| 2002/0093032 A1 | 7/2002 | Hanzawa et al. | |
| 2003/0117842 A1 | 6/2003 | Hanzawa et al. | |
| 2004/0080986 A1 | 4/2004 | Hanzawa et al. | |
| 2004/0125648 A1 | 7/2004 | Iwata | |
| 2005/0105326 A1 | 5/2005 | Hanzawa et al. | |
| 2006/0187720 A1 | 8/2006 | Hanzawa et al. | |
| 2007/0104002 A1 | 5/2007 | Edahiro | |
| 2007/0230245 A1 | 10/2007 | Watanabe et al. | |
| 2008/0089137 A1 | 4/2008 | Hanzawa et al. | |
| 2009/0238013 A1 | 9/2009 | Hanzawa et al. | |
| 2009/0251948 A1 | 10/2009 | Kajigaya et al. | |
| 2010/0315895 A1 | 12/2010 | Hanzawa et al. | |
| 2011/0063898 A1 | 3/2011 | Ong | |
| 2011/0194333 A1 | 8/2011 | Kim et al. | |
| 2011/0299330 A1 | 12/2011 | Ong | |
| 2012/0020159 A1 | 1/2012 | Ong | |
| 2012/0087172 A1 | 4/2012 | Aoki | |
| 2012/0155157 A1 | 6/2012 | Oh | |
| 2012/0206167 A1 | 8/2012 | Ong et al. | |
| 2013/0051114 A1 | 2/2013 | Kim et al. | |
| 2013/0212207 A1 | 8/2013 | Ong | |
| 2013/0212431 A1 | 8/2013 | Ong | |
| 2014/0157065 A1 | 6/2014 | Ong | |

FOREIGN PATENT DOCUMENTS

| | | |
|---|---|---|
| JP | 7-141881 A | 6/1995 |
| JP | 11-149783 A | 6/1999 |
| JP | 2003-100080 | 4/2003 |
| JP | 2003-529879 A | 10/2003 |
| JP | 2004-206796 A | 7/2004 |
| JP | 2005-228378 | 8/2005 |
| JP | 2007-133927 A | 5/2007 |
| JP | 2009-64498 | 3/2009 |
| JP | 2009-266364 A | 11/2009 |
| JP | 2009-266364 A5 | 11/2009 |
| JP | 2010-267373 | 11/2010 |
| JP | 2012-84202 | 4/2012 |
| JP | 2012-84218 | 4/2012 |
| JP | 2012-133857 | 7/2012 |
| JP | 2013-504835 | 2/2013 |
| JP | 2013-45498 | 3/2013 |
| JP | 2013-519183 | 5/2013 |
| JP | 2013-164849 | 8/2013 |

OTHER PUBLICATIONS

Written Opinion issued Nov. 25, 2014 in PCT/JP2014/074478, filed Sep. 17, 2014.

* cited by examiner

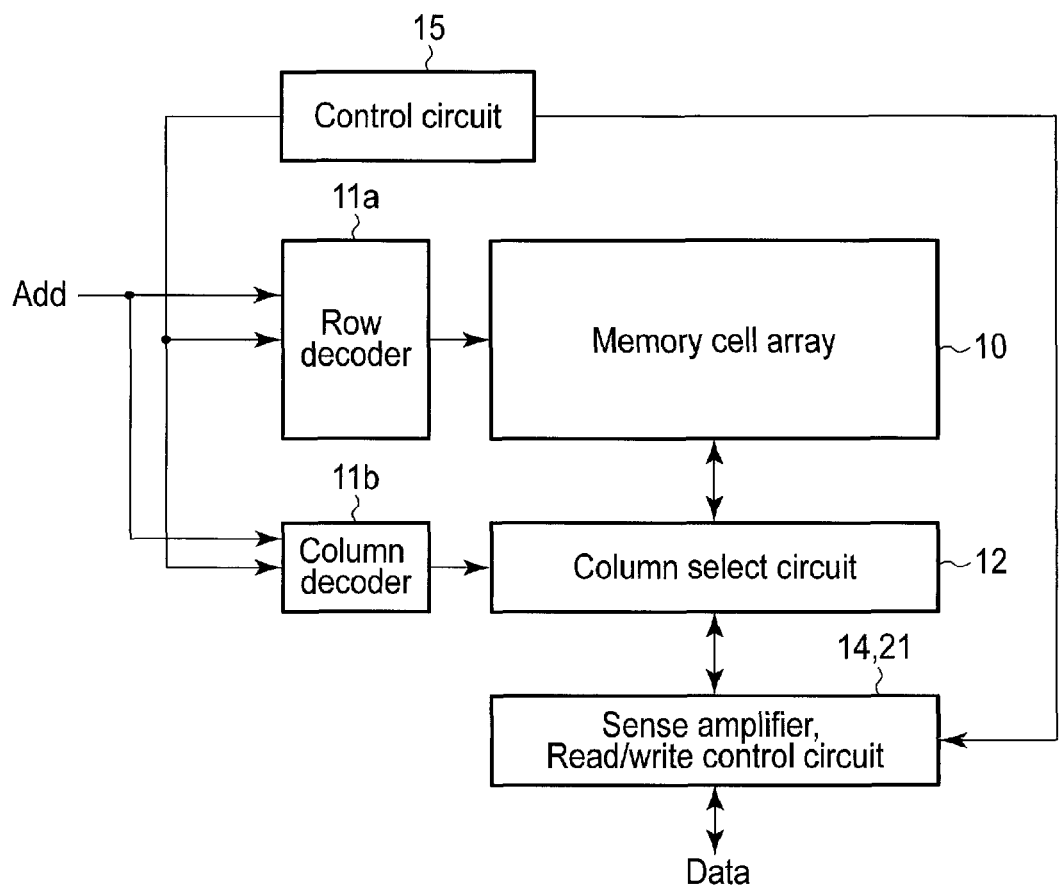
F I G. 1

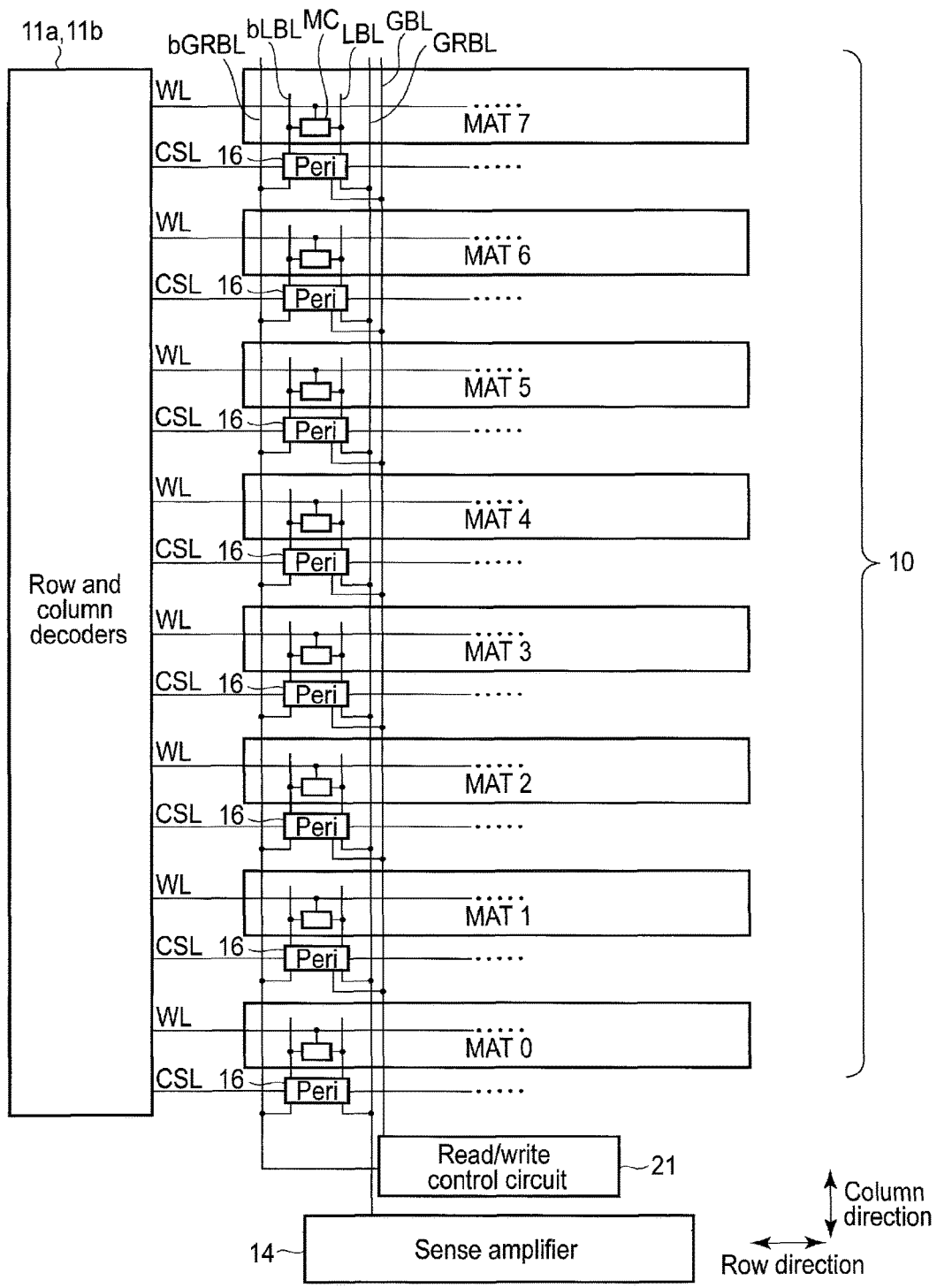
F I G. 2

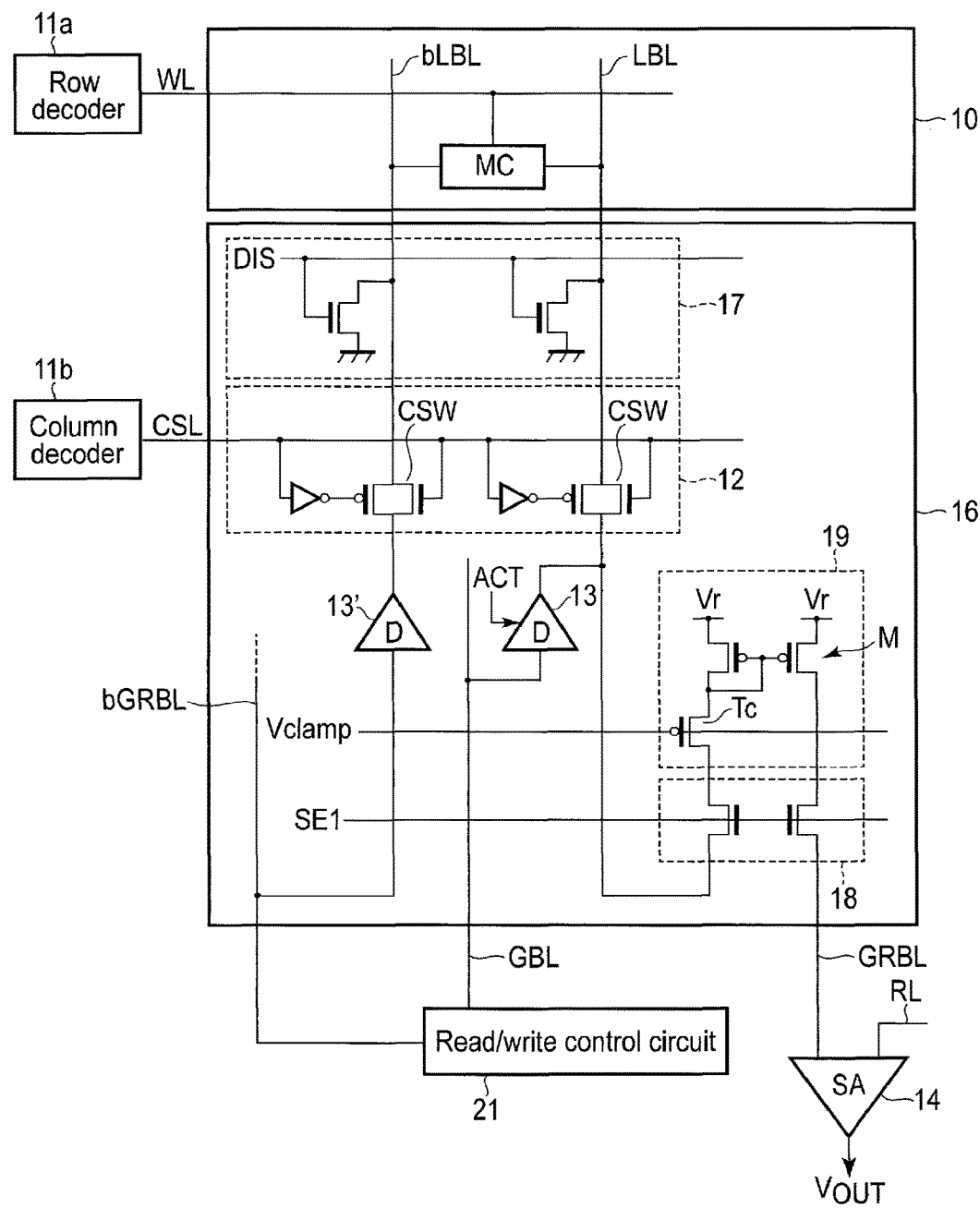
F I G. 3

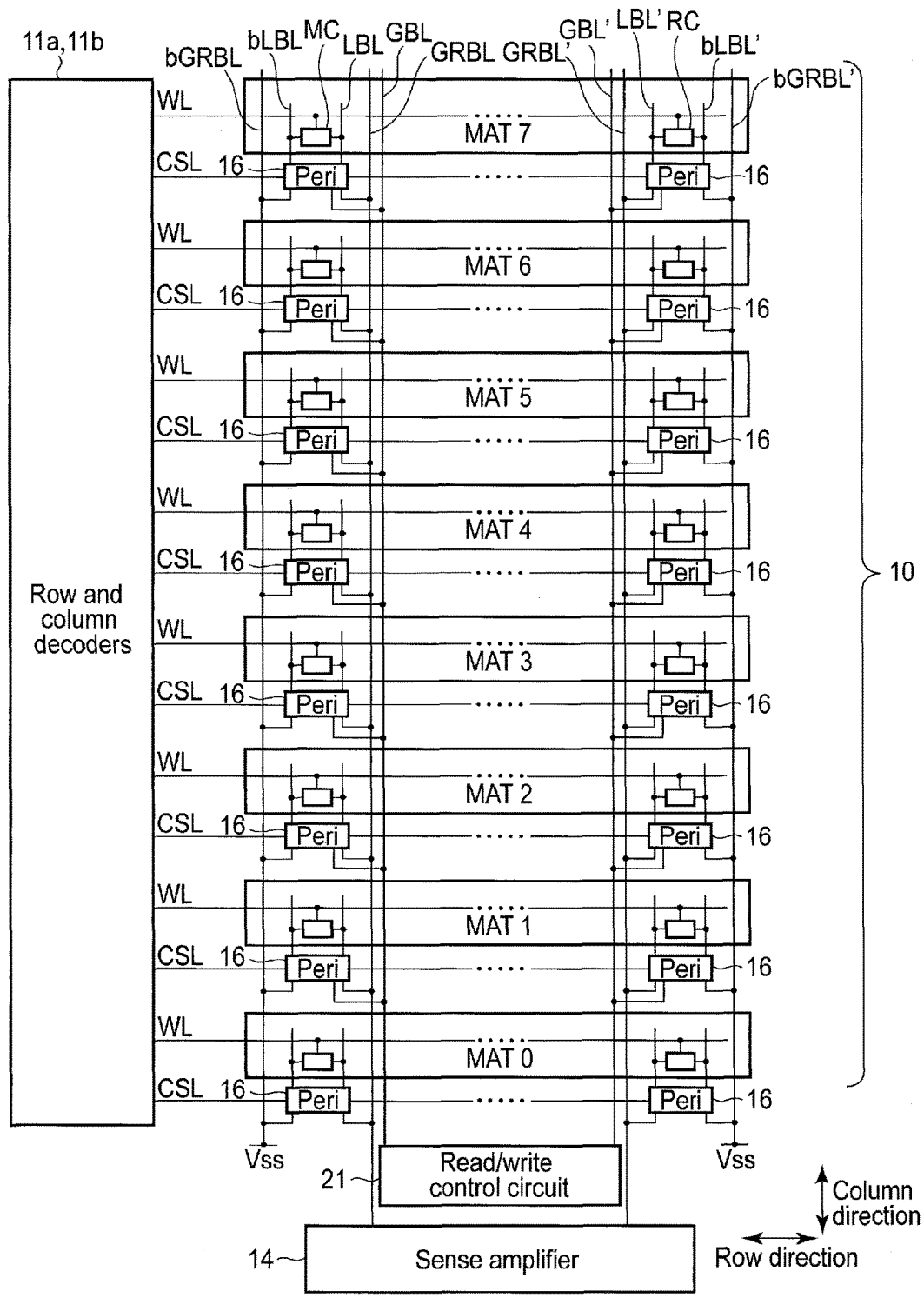
F I G. 4

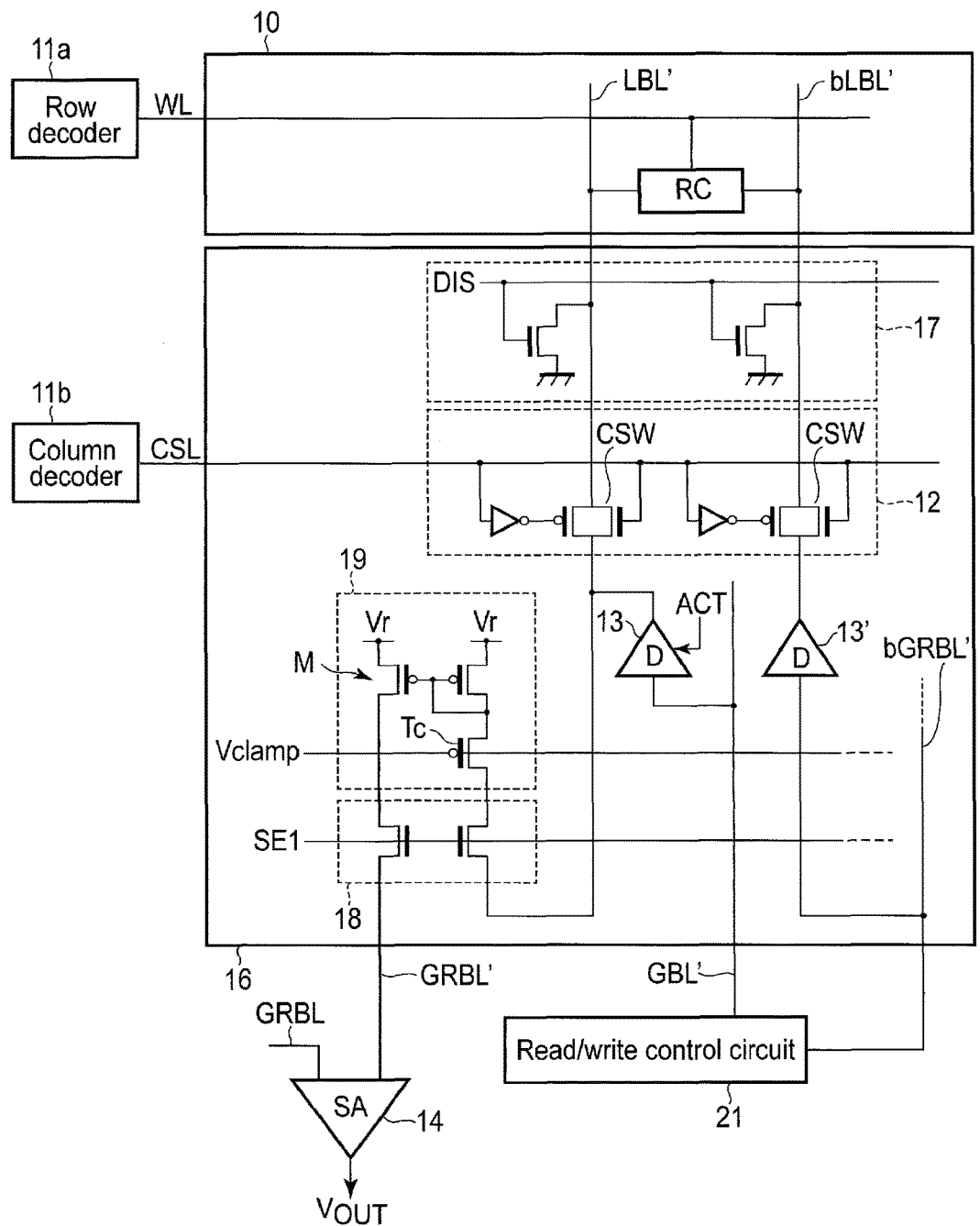
F I G. 6

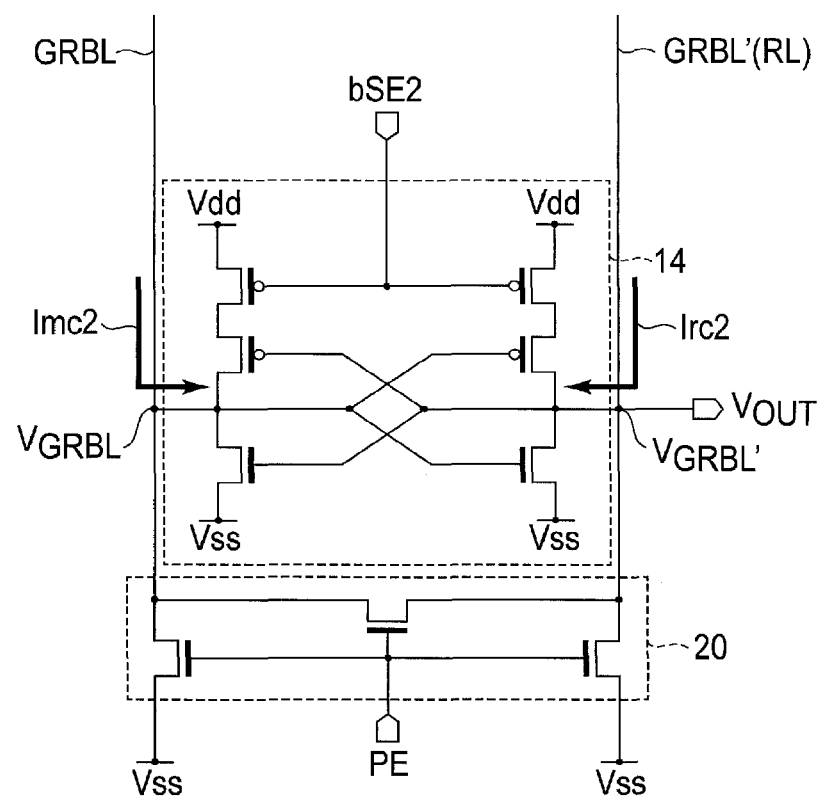
F I G. 7

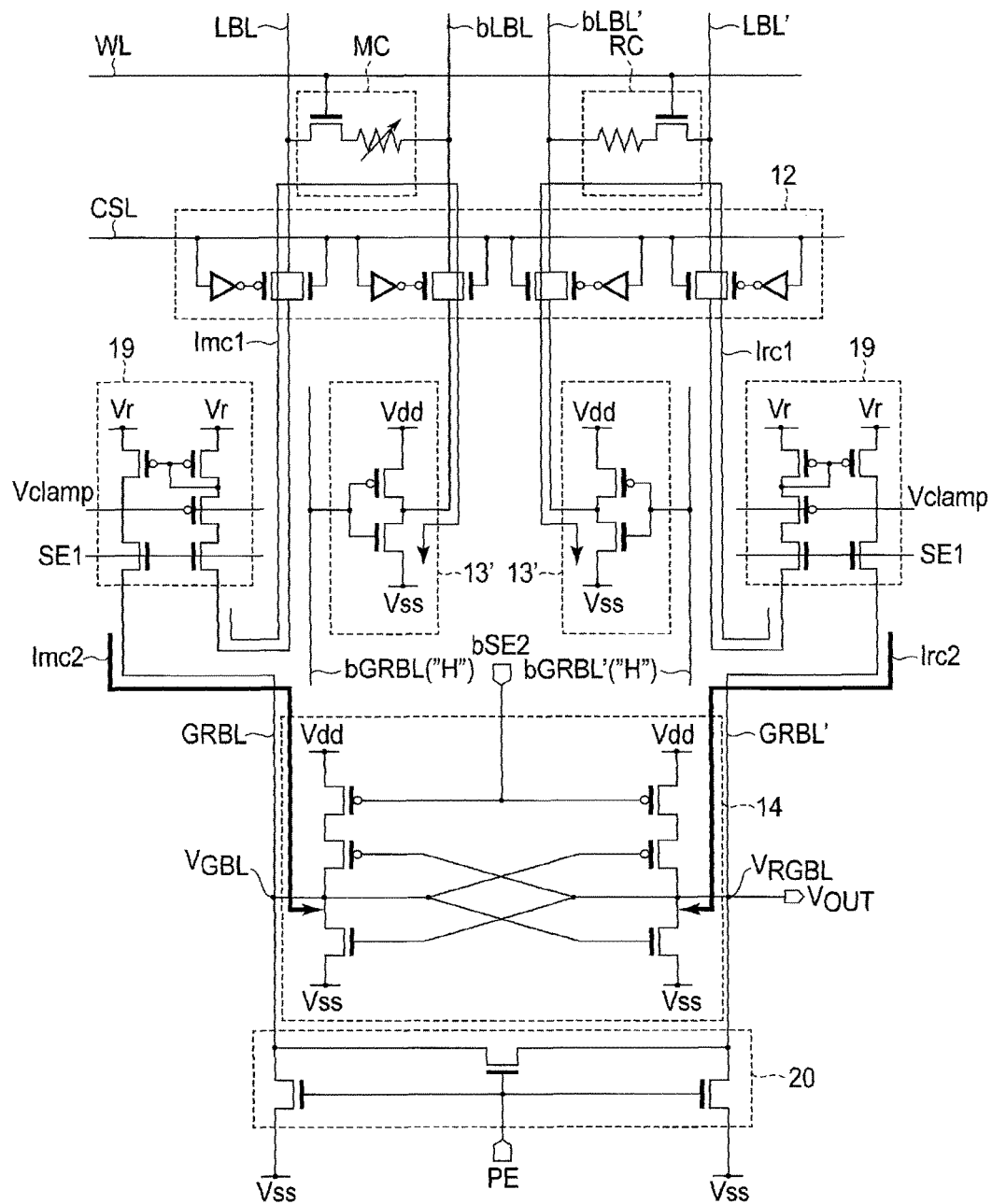
F I G. 9

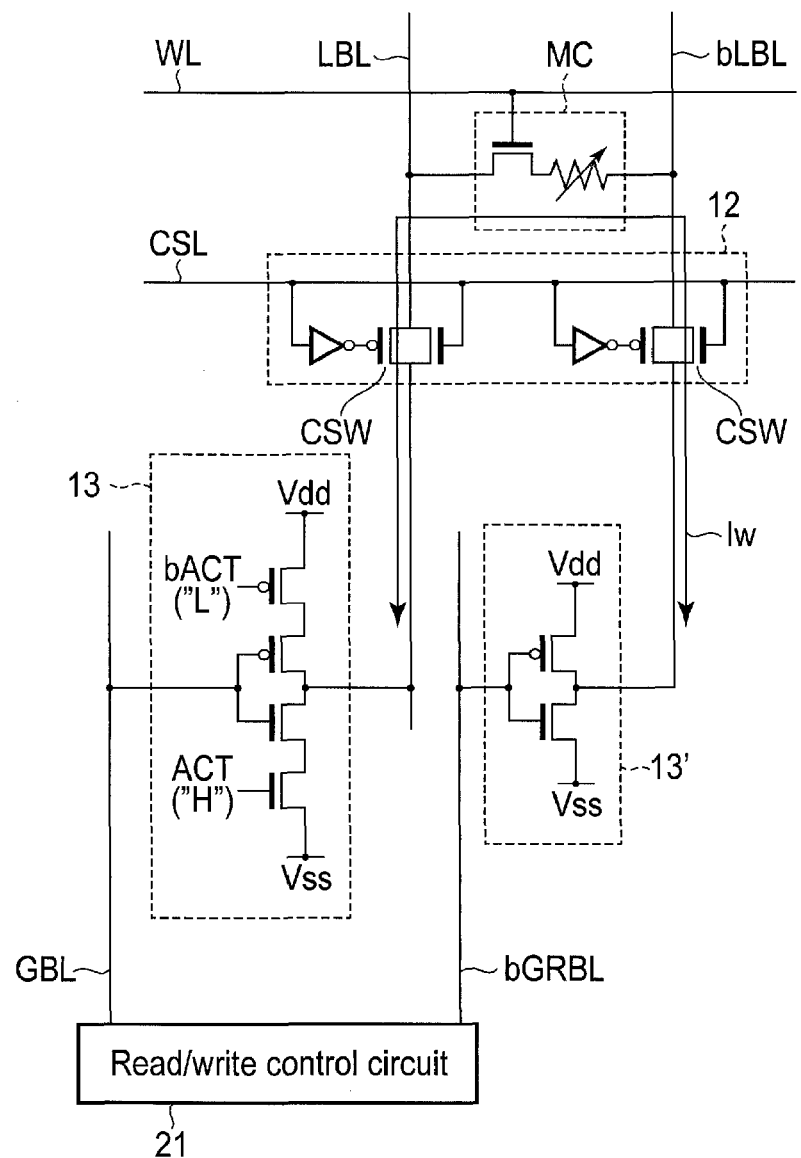
F I G. 10

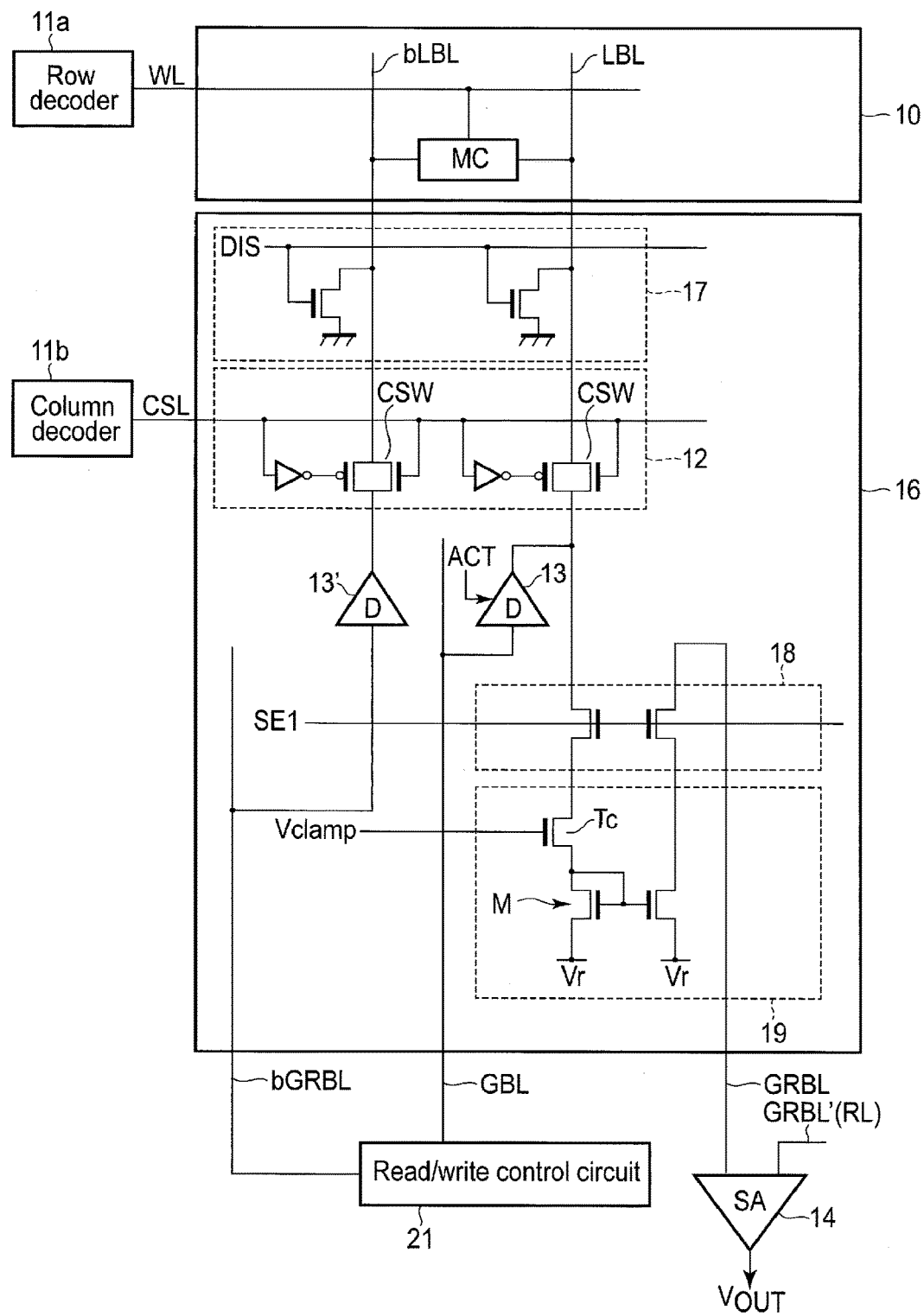
F I G. 11

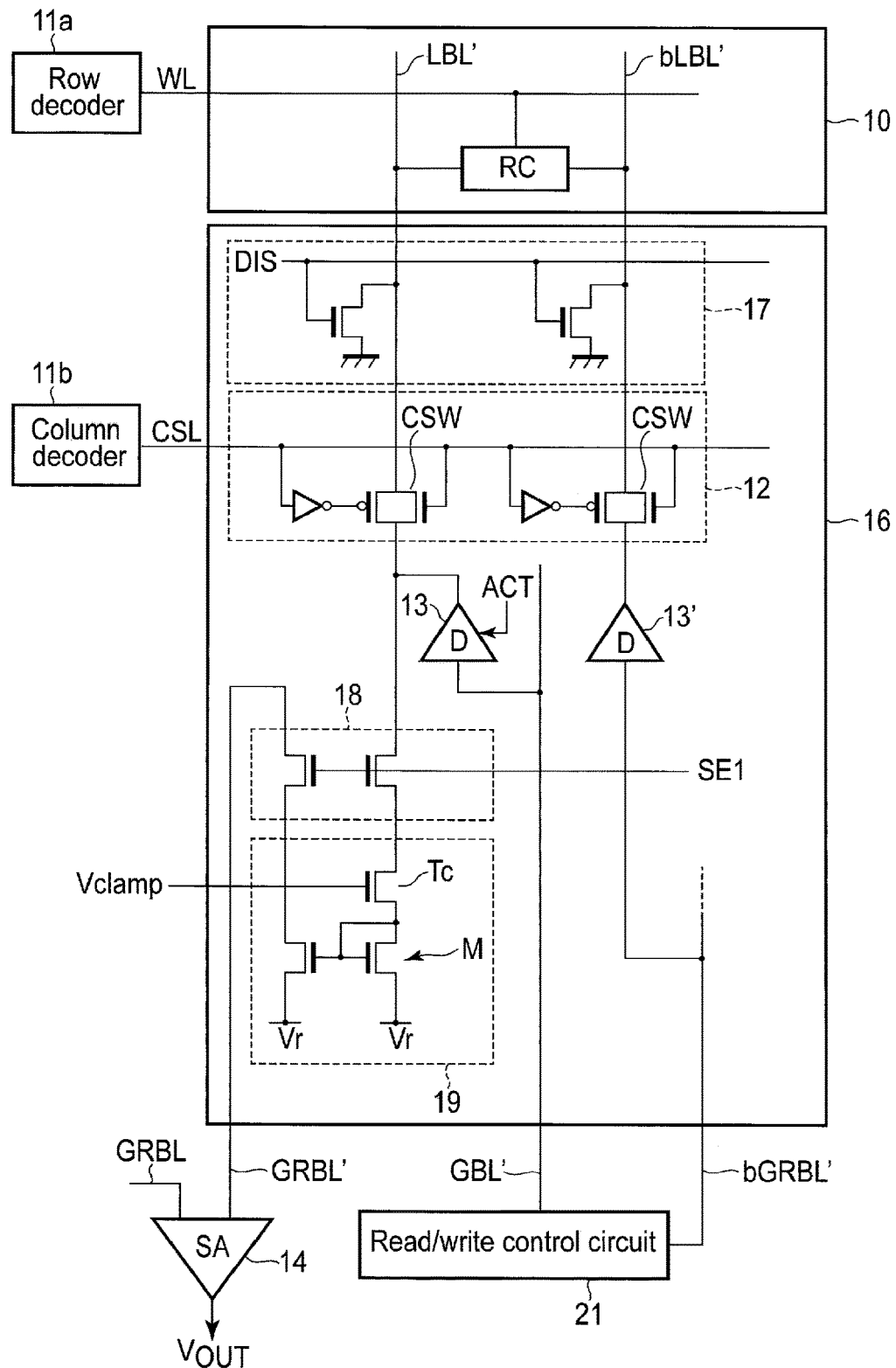
F I G. 12

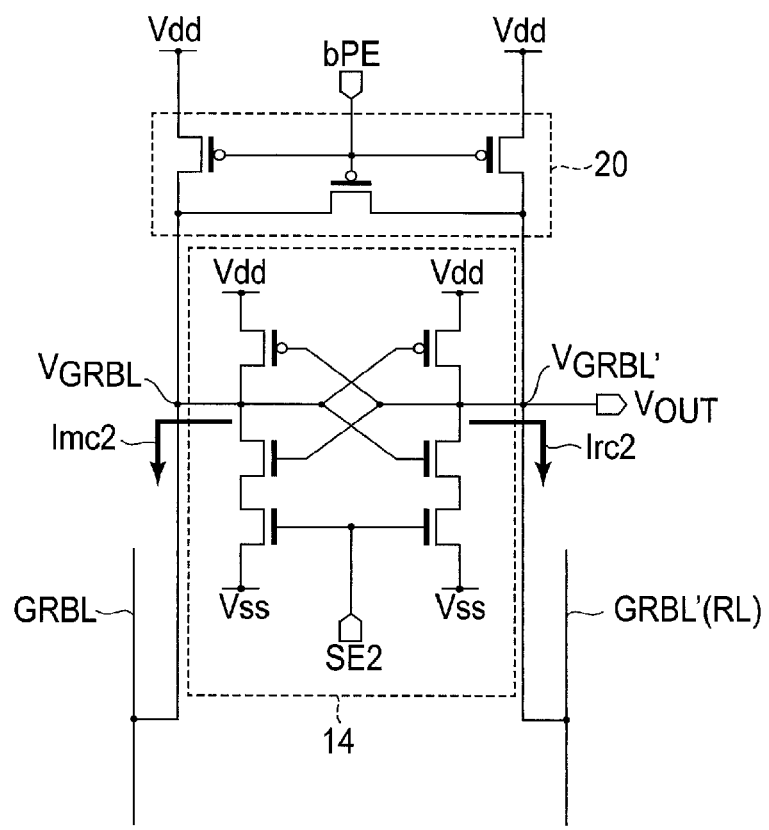
F I G. 13

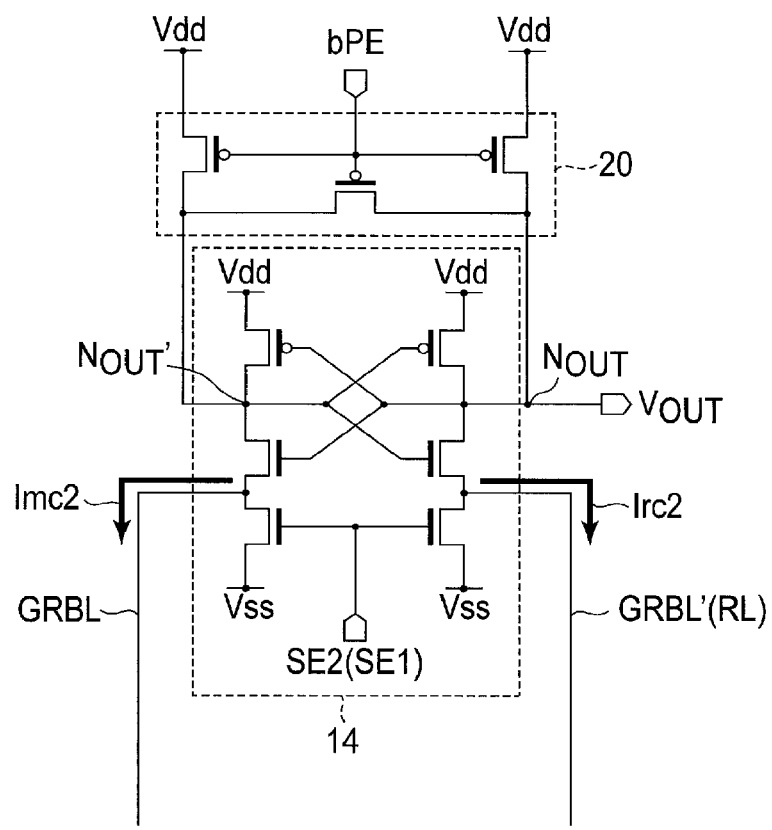
F I G. 14

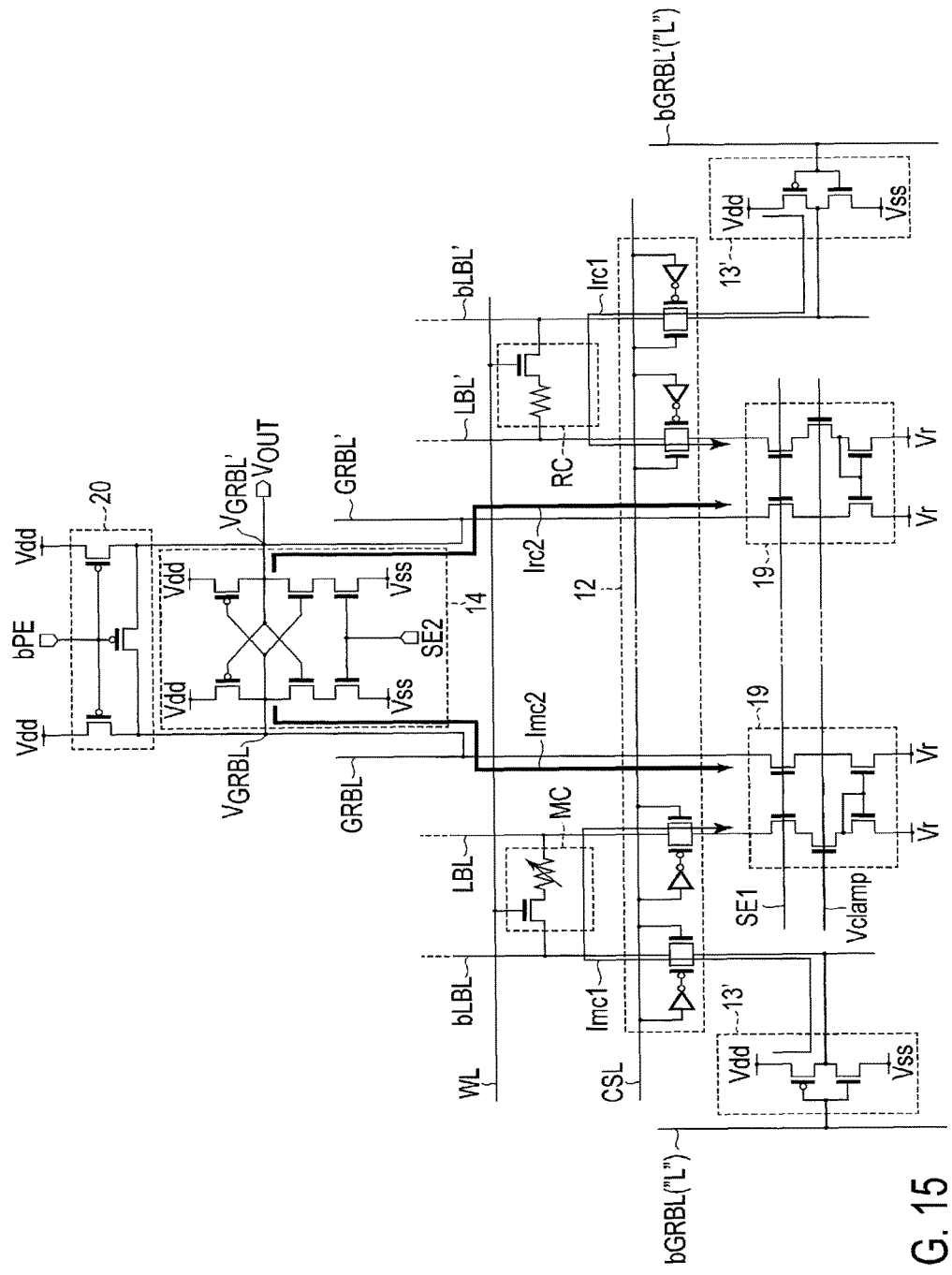
F I G. 15

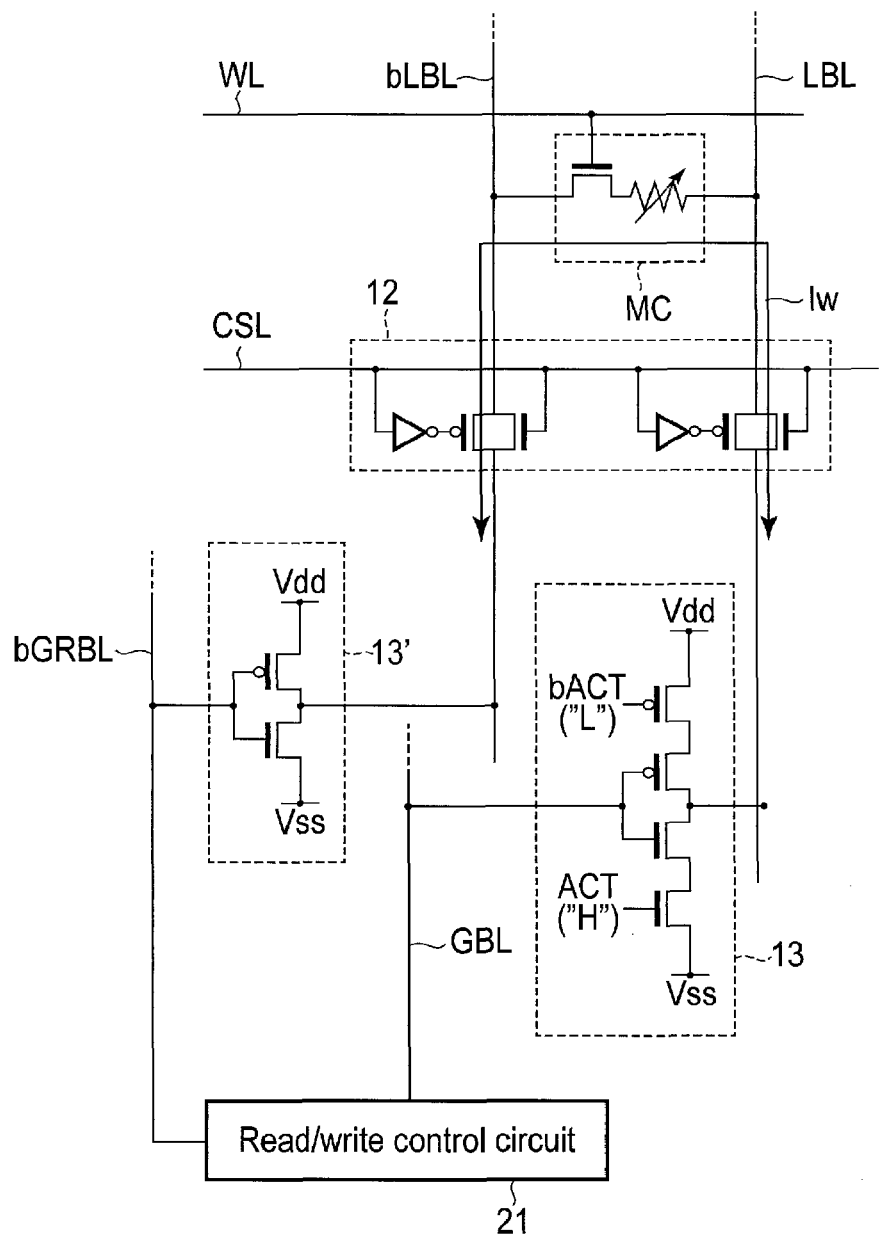
F I G. 16

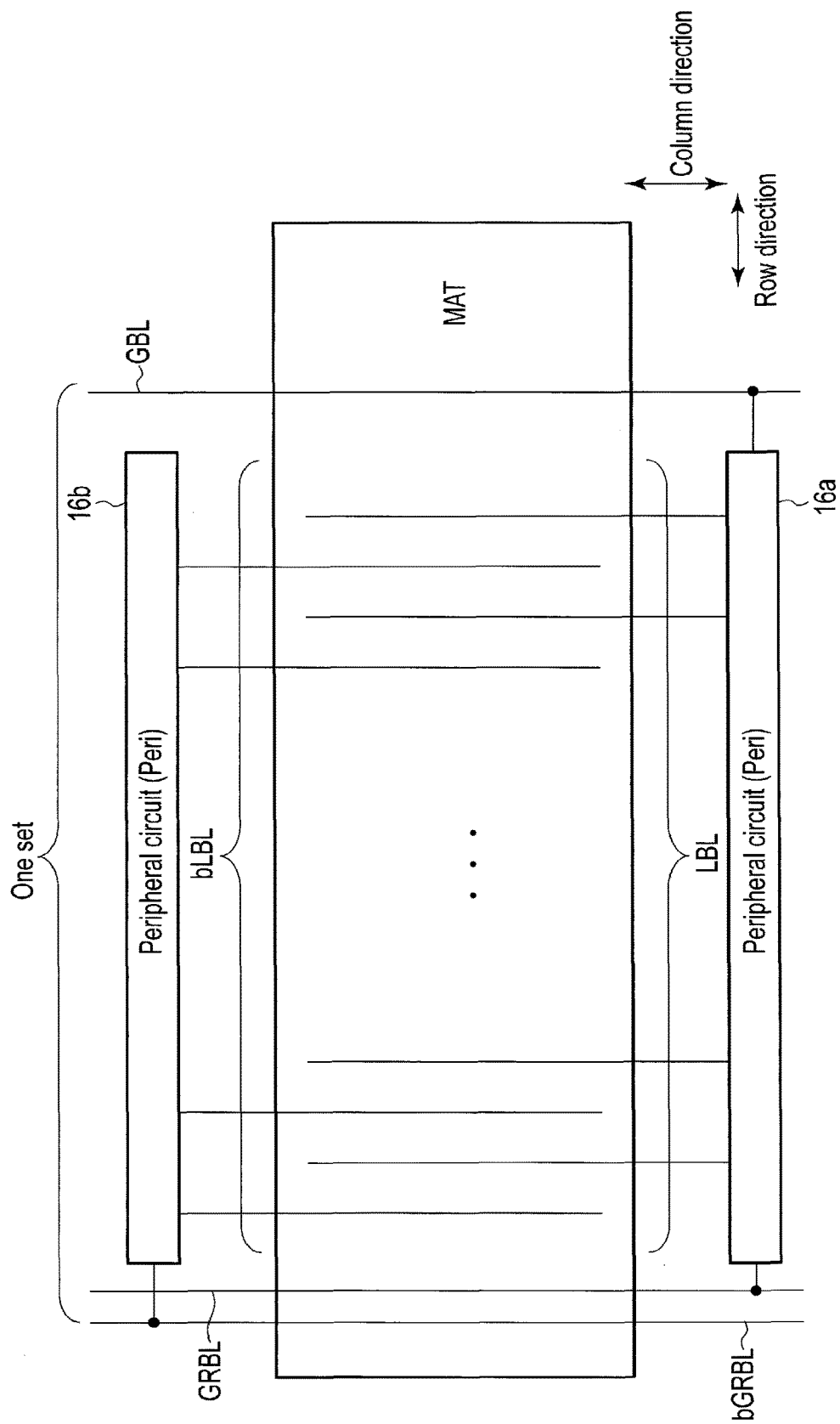
F I G. 17

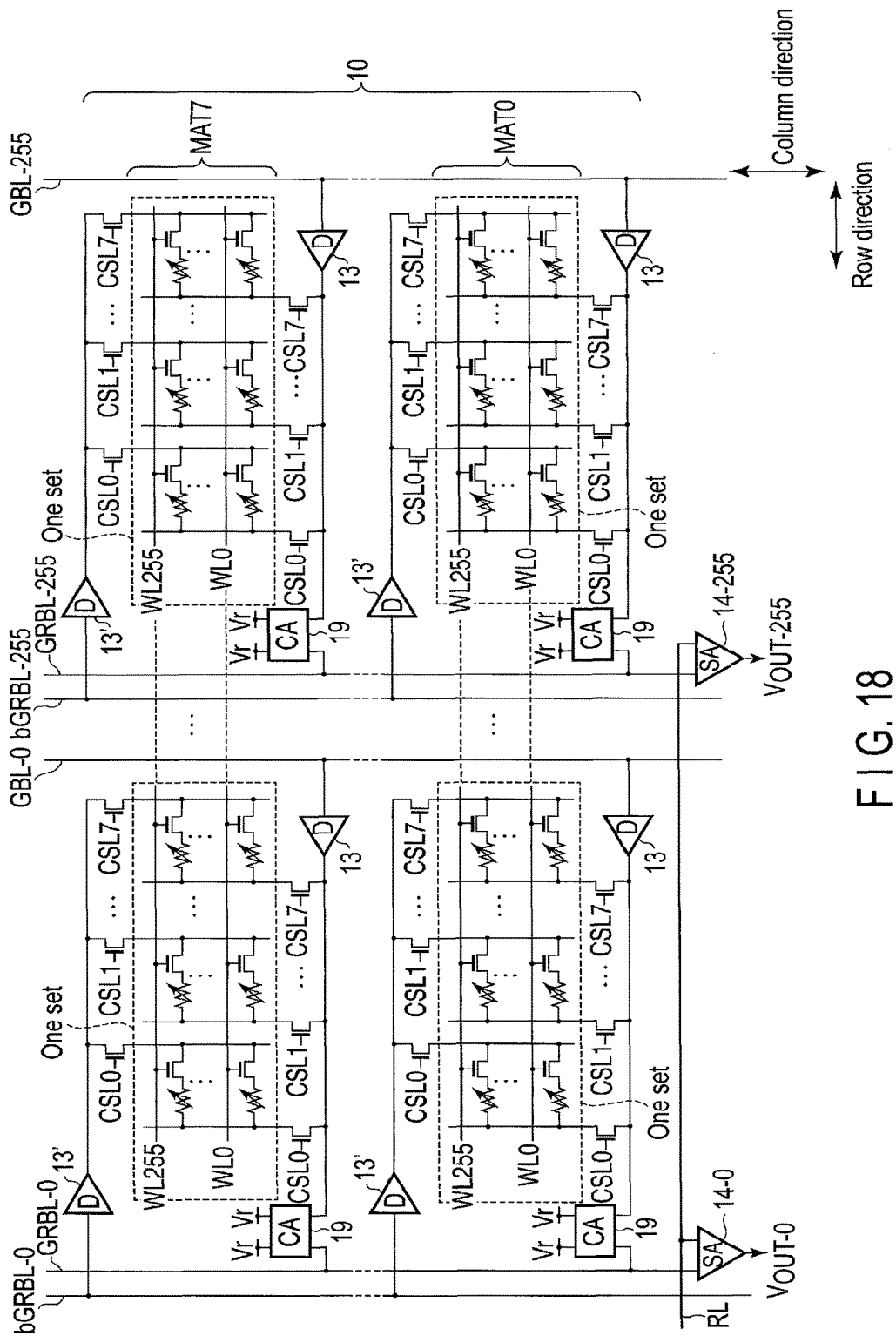
F I G. 18

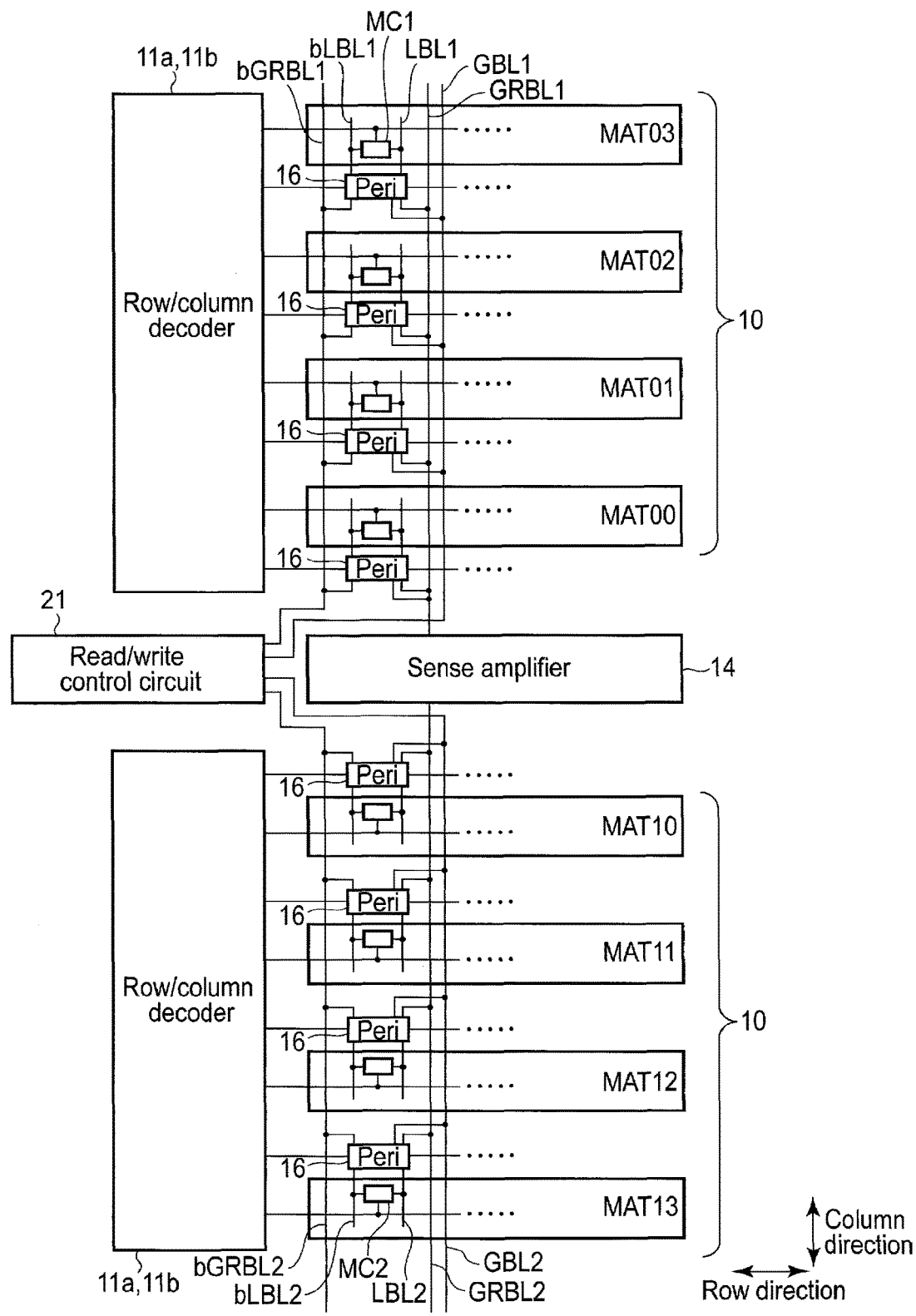
F I G. 20

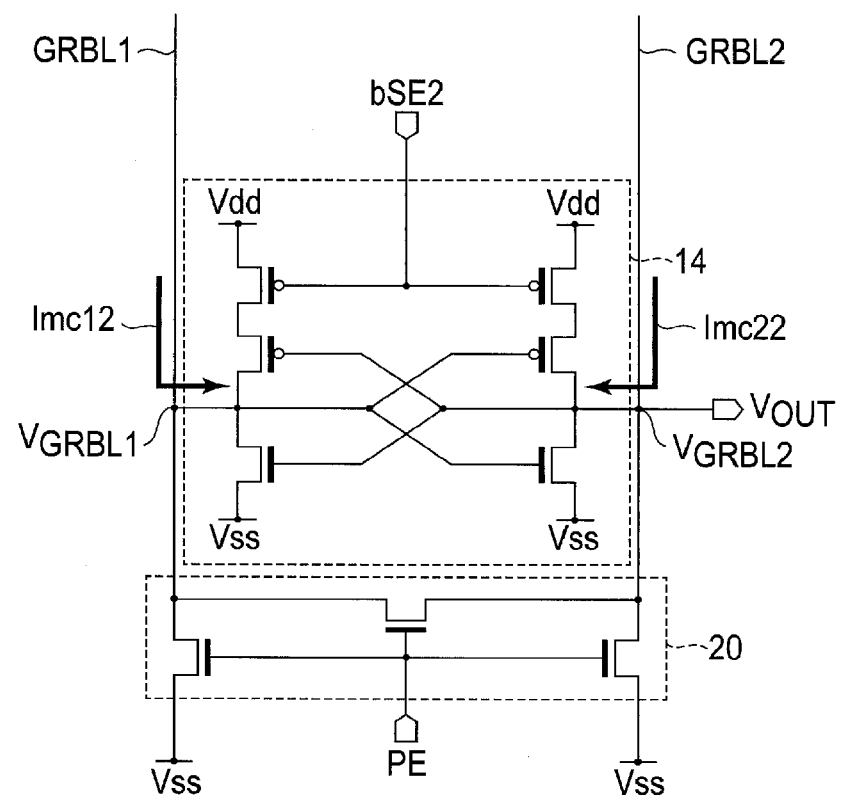
F I G. 21

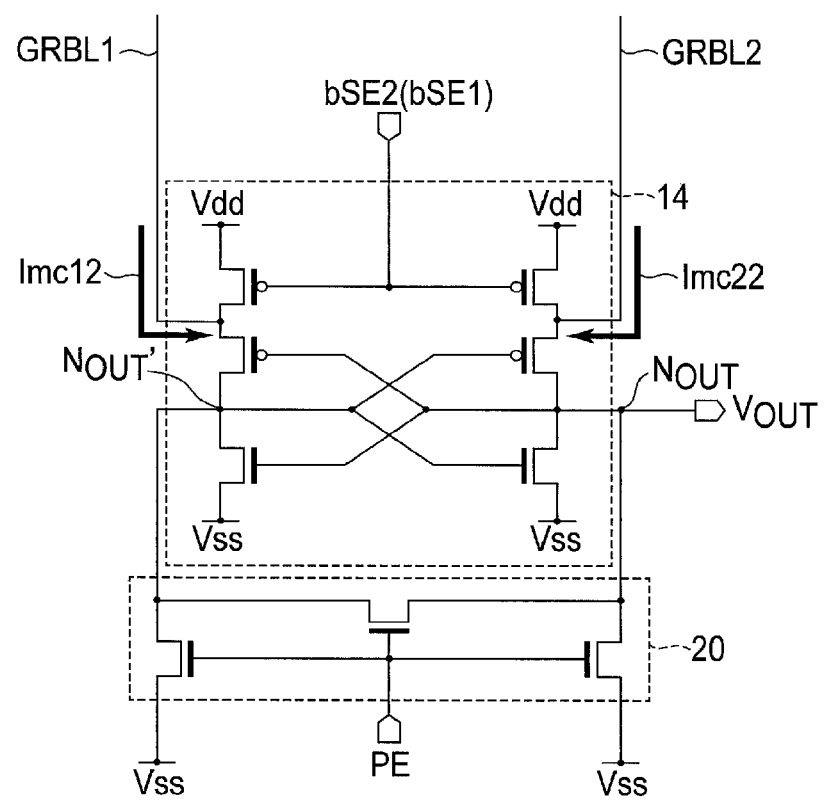
F I G. 22

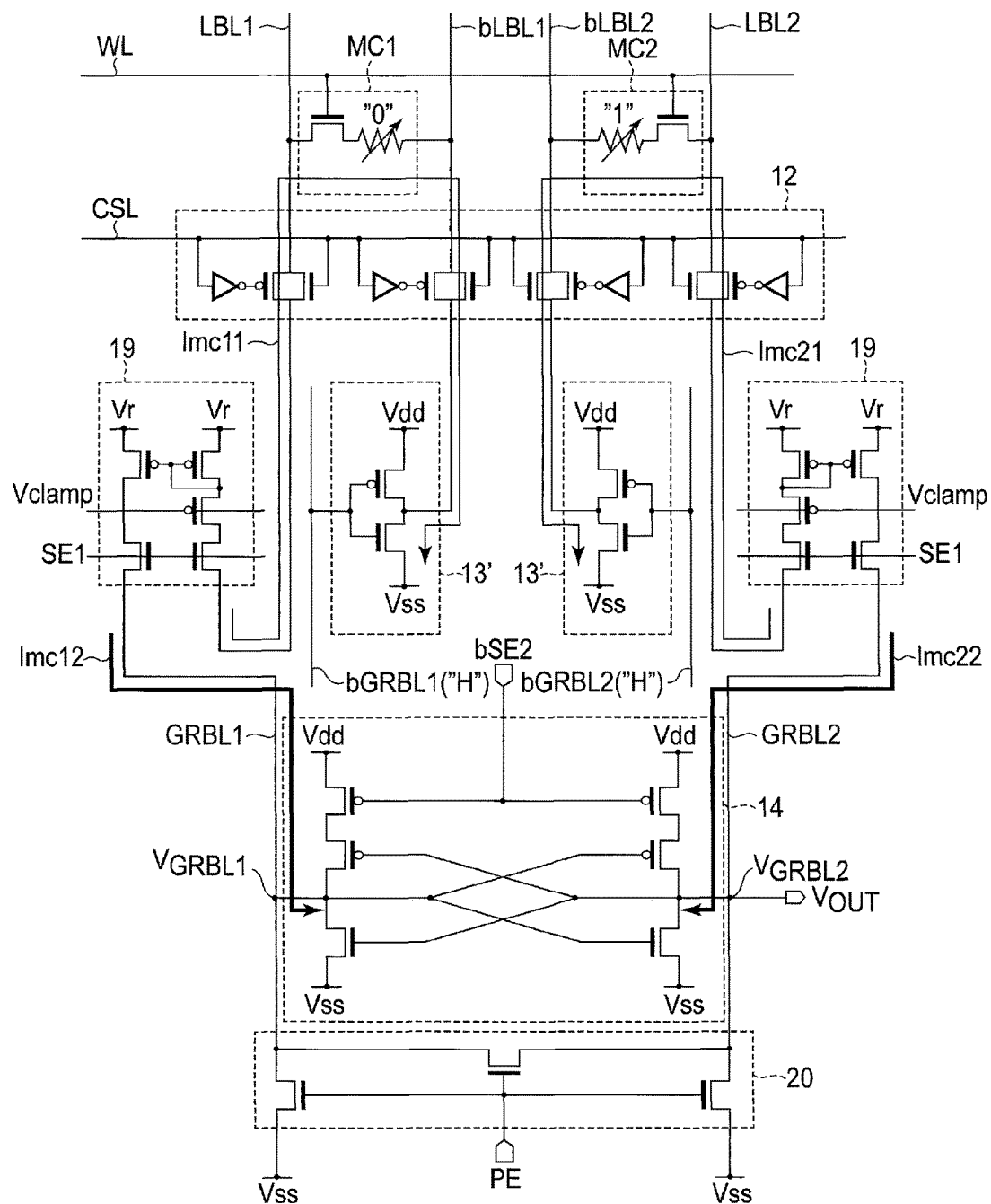
F I G. 23

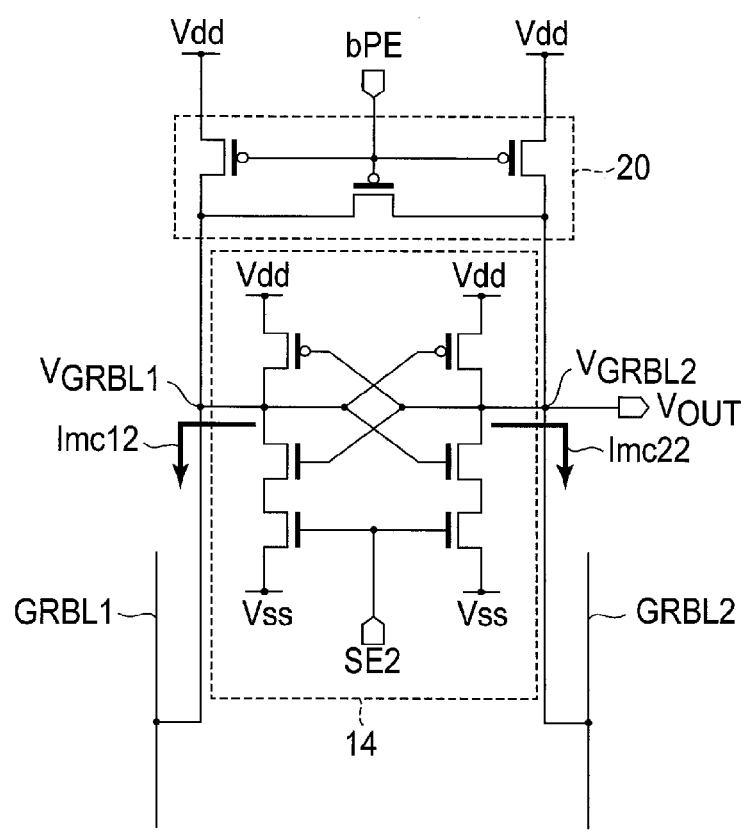
F I G. 24

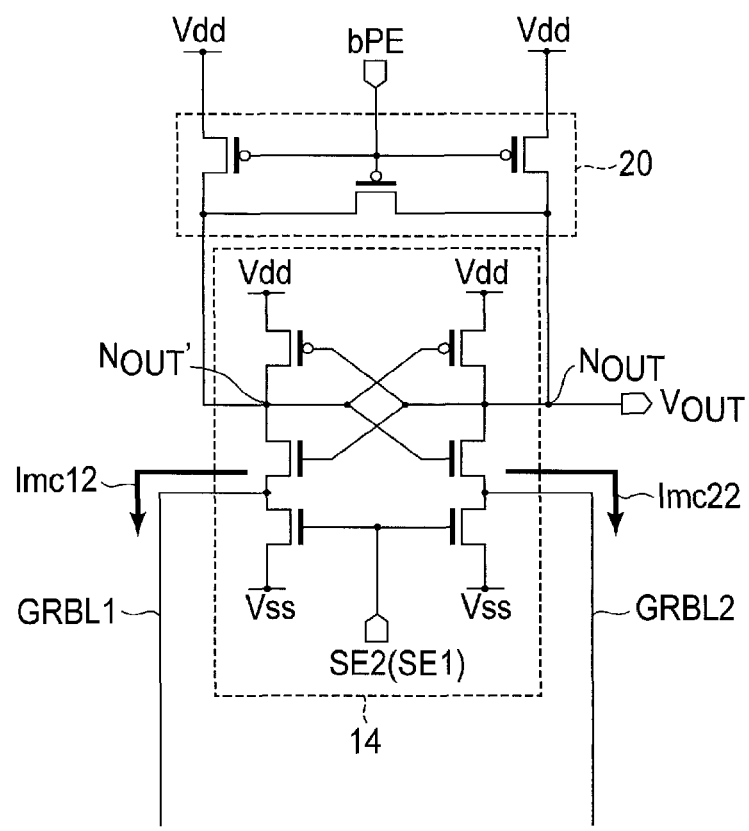
F I G. 25

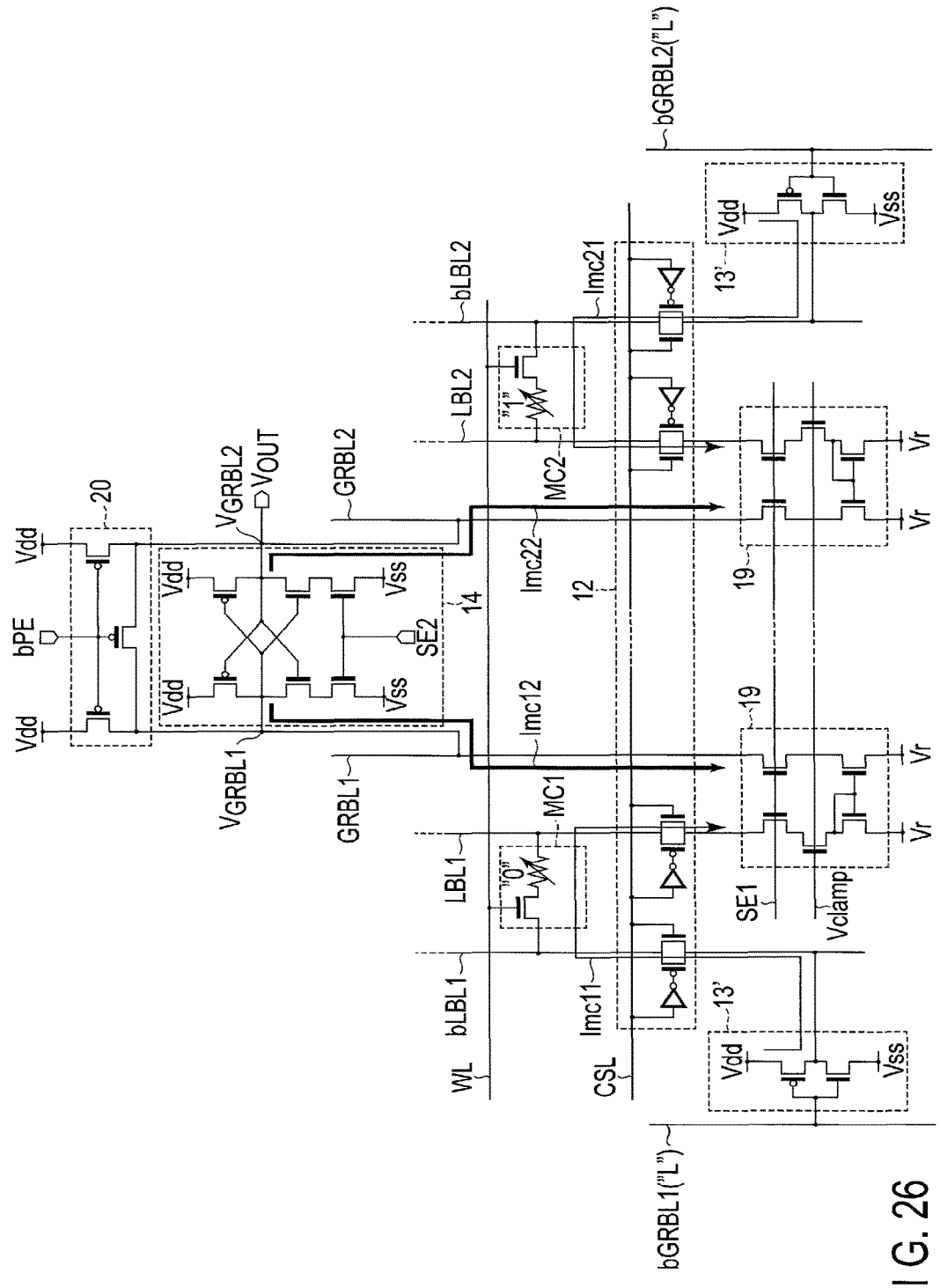
F I G. 26

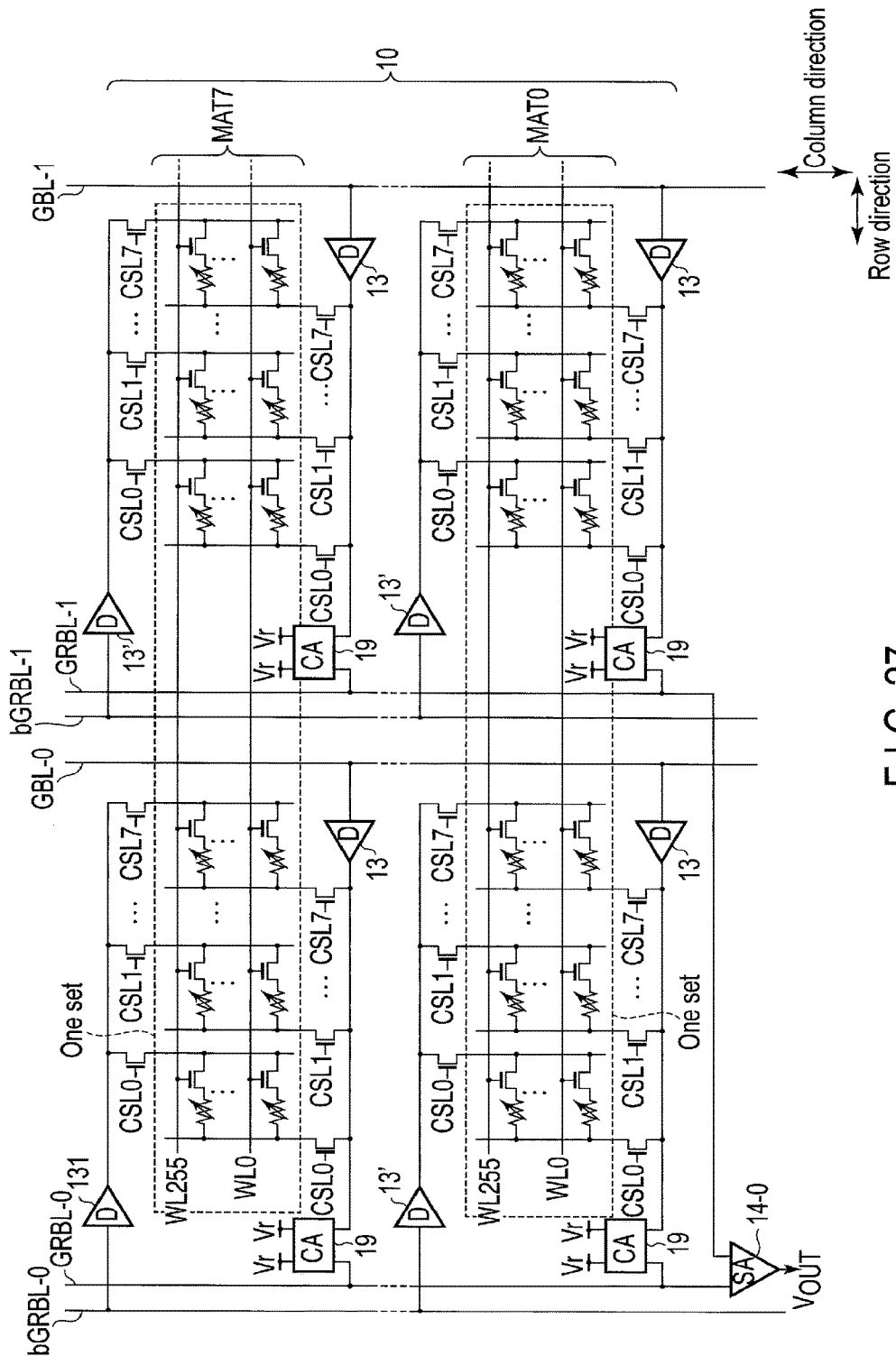
F I G. 27

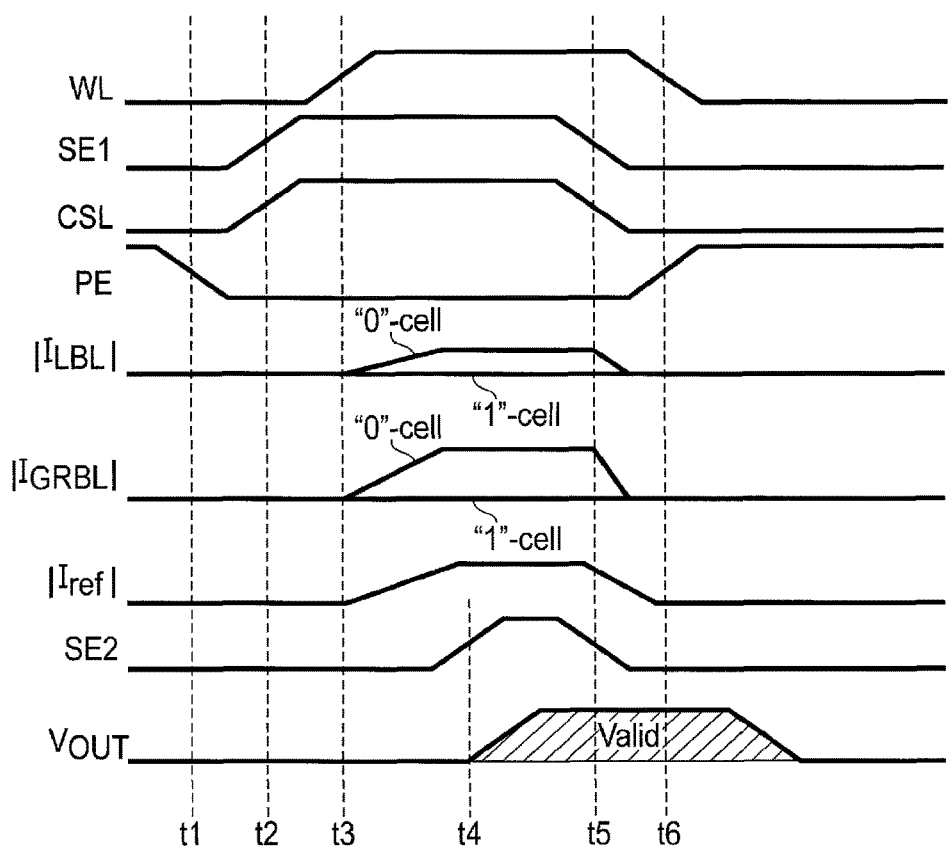
F I G. 28

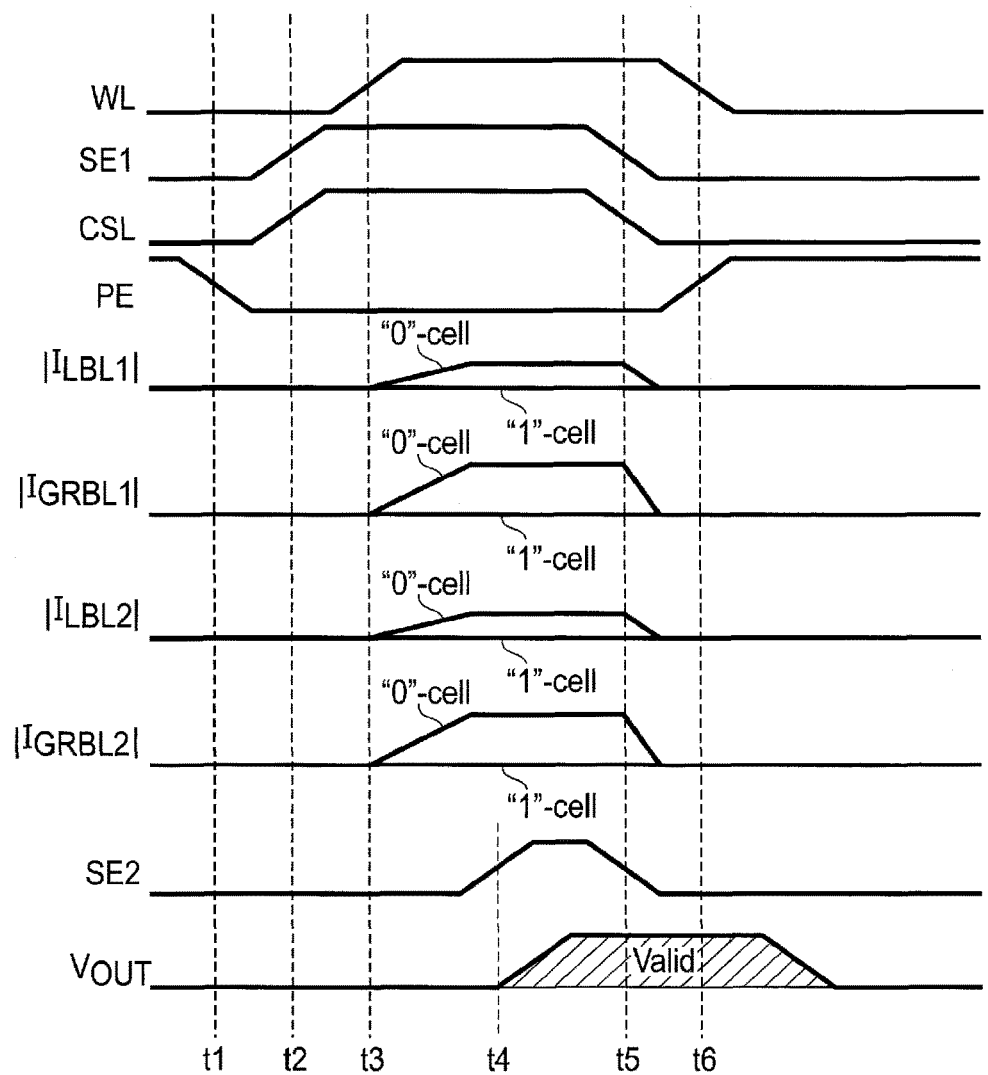
F I G. 29

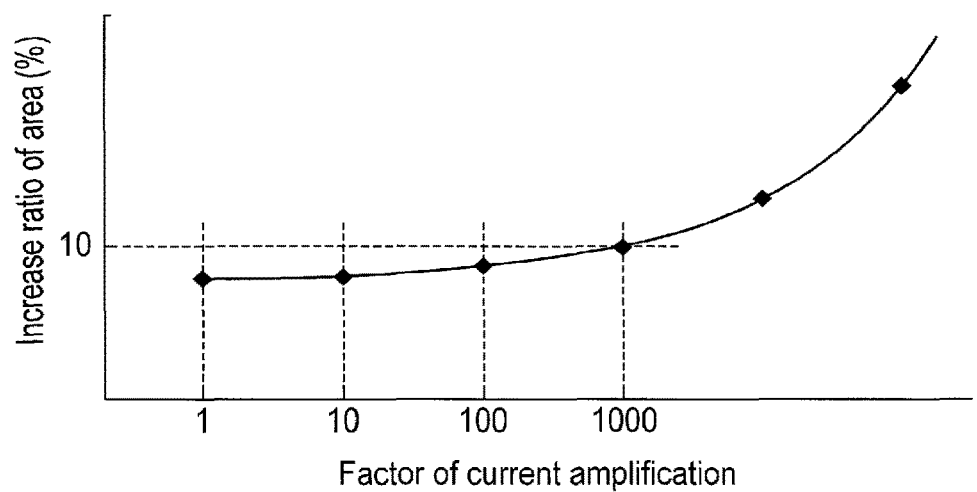
F I G. 31

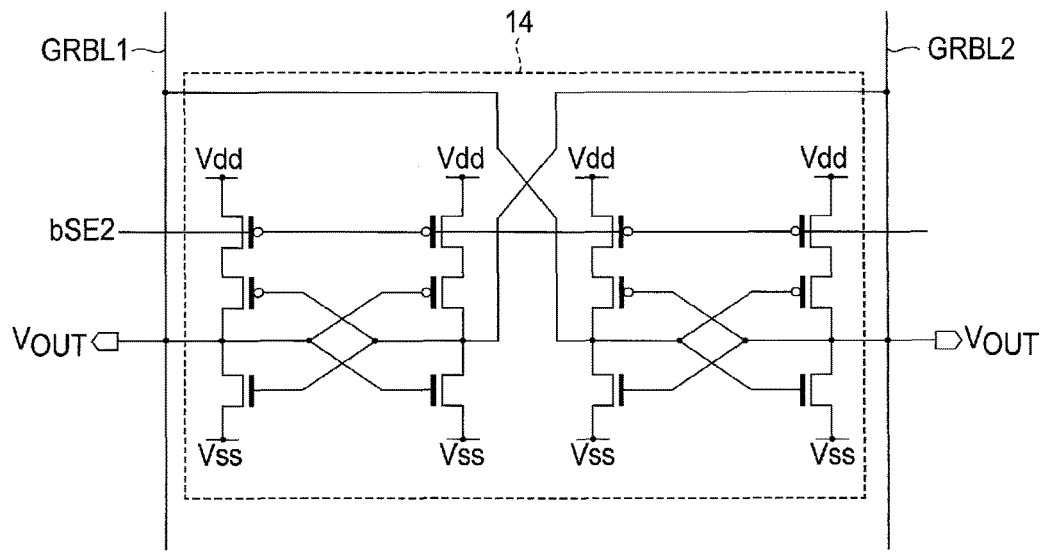
F I G. 32
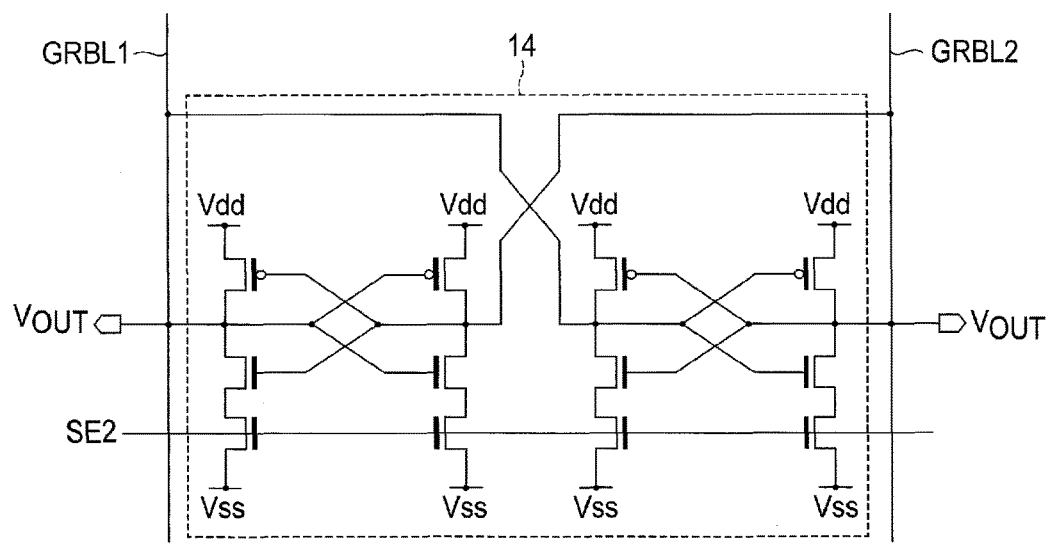
F I G. 33

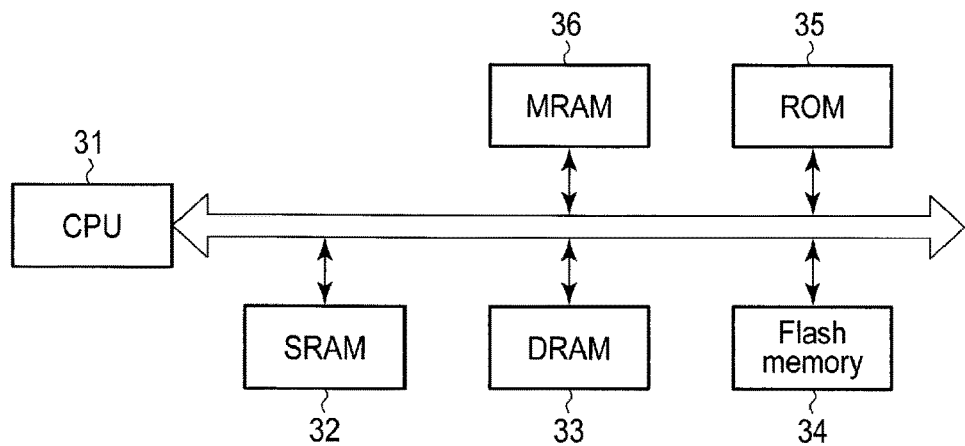
F I G. 34
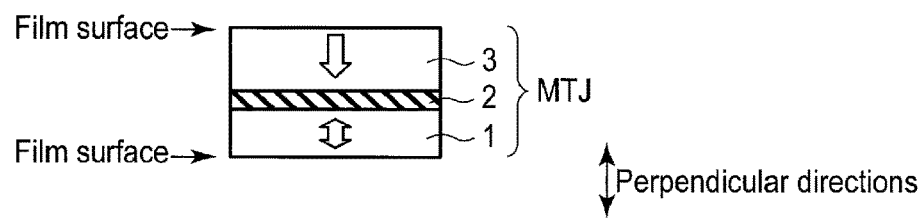
F I G. 35
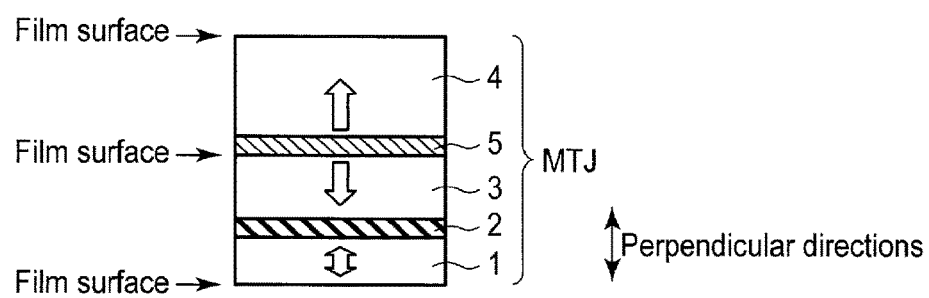
F I G. 36

SEMICONDUCTOR MEMORY

CROSS REFERENCE TO RELATED APPLICATIONS

This application is a Continuation Application of PCT Application No. PCT/JP2014/074478, filed Sep. 17, 2014 and based upon and claiming the benefit of priority from Japanese Patent Application No. 2014-058771, filed Mar. 20, 2014, the entire contents of all of which are incorporated herein by reference.

FIELD

Embodiments described herein relate generally to a semiconductor memory.

BACKGROUND

Resistance change memories, such as magnetic random access memories have the advantages of lower static power and smaller cell size than static random access memories (SRAM), and the like. Thus, an attempt to use an SRAM in place of a resistance change memory as a cache memory is made. In particular, a spin-transfer-torque magnetic random access memory (STT-MRAM) can make the write current relatively small and thus is highly applicable to a cache memory.

However, the memory cell (resistance change element) of the resistance change memory is generally a two-terminal element and has the same path for write current and read current. Accordingly, the write current decreases and a current difference (margin) between the write current and the read current becomes small, with the result that a read disturbance that a write operation is performed by mistake during the read operation will occur at high probability. If the read current is decreased further to avoid the mistaken write operation, a period of time for amplifying the small read current by a sense amplifier is increased and the read speed is decreased.

BRIEF DESCRIPTION OF THE DRAWINGS

FIG. 1 is a general view of a resistance change memory.
FIG. 2 is a diagram showing an example of a hierarchical bit line structure.
FIG. 3 is a diagram showing an example of a peripheral circuit of a memory cell.
FIG. 4 is a diagram showing an example of a hierarchical bit line structure.
FIG. 6 is a diagram showing an example of a peripheral circuit of a reference cell.
FIG. 7 is a diagram showing an example of a voltage read sense amplifier.
FIG. 9 is a diagram showing an example of a read operation.
FIG. 10 is a diagram showing an example of a write operation.
FIG. 11 is a diagram showing an example of a peripheral circuit of a memory cell.
FIG. 12 is a diagram showing an example of a peripheral circuit of a reference cell.
FIG. 13 is a diagram showing an example of a voltage read sense amplifier.
FIG. 14 is a diagram showing an example of a current read sense amplifier.
FIG. 15 is a diagram showing an example of a read operation.
FIG. 16 is a diagram showing an example of a write operation.
FIG. 17 is a diagram showing an example of the layout of peripheral circuits.
FIG. 18 is a diagram showing an example of the layout of a memory cell array.
FIGS. 19 and 20 are diagrams, each showing an example of a hierarchical bit line structure.
FIG. 21 is a diagram showing an example of a voltage read sense amplifier.
FIG. 22 is a diagram showing an example of a current read sense amplifier.
FIG. 23 is a diagram showing an example of a read operation.
FIG. 24 is a diagram showing an example of a voltage read sense amplifier.
FIG. 25 is a diagram showing an example of a current read sense amplifier.
FIG. 26 is a diagram showing an example of a read operation.
FIG. 27 is a diagram showing an example of the layout of peripheral circuits.
FIGS. 28 and 29 are charts, each showing operation waveforms of read operation.
FIG. 31 is a graph showing a relationship between the factor of current amplification and the increase ratio of area.
FIGS. 32 and 33 are diagrams, each showing a modification to the sense amplifier.
FIG. 34 is a diagram showing an example of a nonvolatile cache system.
FIGS. 35 and 36 are diagrams, each showing an example of a magnetoresistive element.

DETAILED DESCRIPTION

Figure 5:
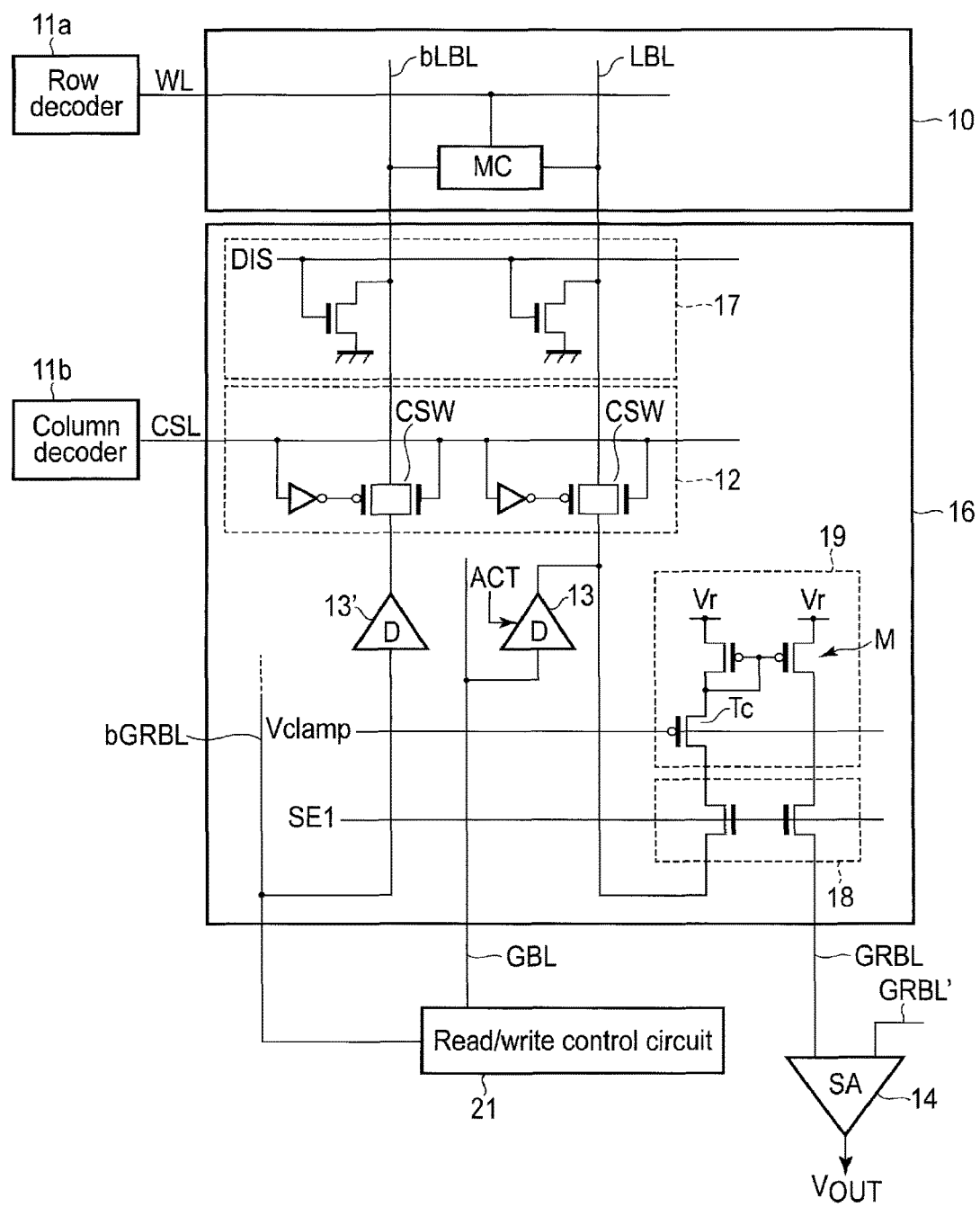
FIG. 5 is a diagram showing an example of a peripheral circuit of a memory cell.

In general, according to one embodiment, a semiconductor memory comprises: a first block array including first to n-th blocks (n is a natural number of 2 or more) arranged in a first direction, each of the first to n-th blocks including a first memory cell; a first conductive line extending in the first direction, and shared by the first to n-th blocks; first to n-th current amplifiers corresponding to the first to n-th blocks, the i-th current amplifier (i is one of 1 to n) including an input terminal and an output terminal, the input terminal of the i-th current amplifier being electrically connected to the first memory cell in the i-th block, the output terminal of the i-th current amplifier being electrically connected to the first conductive line; and a sense amplifier electrically connected to the first conductive line.

Hereinafter, embodiments will be described with reference to the accompanying drawings.

(Overall Structure)

FIG. 1 shows a main part of a resistance change memory.

A block array 10 includes a plurality of resistance change elements (memory cells). A row decoder 11a and a column decoder 11b randomly access the resistance change elements in the block array 10 in response to an address signal Add.

A column select circuit 12 serves to connect the block array 10 to a sense amplifier 14 electrically in response to a signal from the column decoder 11b.

A read/write control circuit 21 causes read current to flow through the resistance change elements in the block array 10 during a read operation. The sense amplifier 14 senses the read current and reads data from the resistance change elements. The read/write control circuit 21 causes write current to flow through the resistance change elements in the block array 10 during a write operation and thus writes data to the resistance change elements.

A control circuit 15 controls the operations of the row decoder 11a, column decoder 11b, sense amplifier 14 and read/write control circuit 21.

(Hierarchical Bit Line Structure)

The embodiments are premised on a hierarchical bit line structure.

In the resistance change memory, as the memory cells are miniaturized and the memory capacity is increased, the bit lines are thinned and lengthened to increase the resistance of the bit lines. To resolve this problem, the following architecture (hierarchical bit line structure) is adopted in the memory cells. The memory cell array is divided into a plurality of blocks, and low-resistance global read bit lines are arranged on these blocks to connect the global read bit lines to local bit lines in each of the blocks.

The hierarchical bit line structure makes it possible to shorten a time period (latency) from when an instruction to perform a read operation is given until data can be read from the sense amplifier. Adopting a hierarchical bit line structure in the resistance change memory is very effective in applying the resistance change memory to, for example, a cache memory that requires high-speed access.

(First Embodiment)

FIG. 2 illustrates a hierarchical bit line structure according to a first embodiment.

The hierarchical bit line structure according to the first embodiment relates to a one-cell-one-bit structure in which one bit is stored in one memory cell.

The block array 10 includes a plurality of blocks MAT0 to MAT7 arranged in the column direction. In this embodiment, the number of blocks is eight; however, this embodiment is not limited to this number. Preferably, the number of blocks is $2^x$ (x is a natural number), such as 32.

Blocks MAT0 to MAT7 include memory cells MC. The memory cells MC include resistance change elements, for example, magnetic resistance change elements. The memory cells MC may include select transistors (for example, FETs) connected in series to the resistance change elements.

The resistance change elements are elements whose resistances vary with current, voltage, an electric field, a magnetic field, or the like.

The row and column decoders 11a and 11b are arranged at one end of the block array 10 in the row direction. A plurality of word lines WL and a plurality of column select lines CSL extend in the row direction. The memory cells MC are selected by the word lines WL and the column select lines CSL. However, one of the word lines WL is selected and one of the column select lines CSL is selected.

Global read bit lines GRBL and bGRBL and global bit lines GBL extend in the column direction on the block array 10. One end of global read bit line GRBL is connected to the sense amplifier 14. One end of global read bit line bGRBL and one of the global bit line GBL are connected to the read/write control circuit 21.

Local bit lines LEL and bLBL are arranged in the plurality of blocks MAT0 to MAT7 and extend in the column direction. The memory cells MC are connected between local bit lines LBL and bLBL. More specifically, when the resistance change elements in the memory cells MC are two-terminal elements, the resistance change elements are connected between local bit lines LBL and bLBL.

The sense amplifier 14 is located at one end of the block array 10 in the column direction. The sense amplifier 14 reads data from the memory cells MC on the basis of sense current that flows through global read bit line GRBL.

Peripheral circuits (Peri) 16 are connected between local bit lines LBL and bLBL and between global read bit lines GRBL and bGRBL. The peripheral circuits 16 are each located between adjacent two of blocks MAT0 to MAT7 or close to a corresponding one of the blocks.

FIG. 3 illustrates an example of the peripheral circuits 16 of FIG. 2.

The column select circuit 12 includes transfer gates connected to local bit lines LBL and bLBL. In this example, the transfer gates include an N-channel transistor (for example, an FET) and a P-channel transistor (for example, an FET). However, the transfer gates may include an N-channel transistor only.

The transfer gates in the column select circuit 12 are turned on when a column select signal CSL goes high.

A write driver 13 is connected between the global bit line GBL and local bit line LBL. The write driver 13 includes an inverter or a buffer, and becomes active (operative) during a write operation and becomes inactive (inoperative) during a read operation.

The active and inactive states are controlled by a control signal ACT. For example, the write driver 13 becomes active when control signal ACT is high and it becomes inactive when control signal ACT is low.

A read/write driver 13' is connected between global read bit line bGRBL and local bit line bLBL. The read/write driver 13' includes an inverter or a buffer.

When data is read from a resistance change element in a memory cell MC, the read/write control circuit 21 controls the read/write driver 13' such that the write driver 13 is made inactive and local bit line bLBL is set at a fixed potential, such as ground potential Vss and a power supply potential Vdd.

When data is written to the resistance change element in the memory cell MC, the read/write control circuit 21 controls the write driver 13 and the read/write driver 13' such that one of local bit lines LBL and bLBL is set at a high potential, such as a power supply potential Vdd and the other is set at a potential lower than the high potential, such as ground potential Vss.

A discharge circuit 17 is connected to local bit lines LBL and bLBL and resets the potentials of these local bit lines LBL and bLBL. For example, when a control signal DIS goes high, local bit lines LBL and bLBL are set at the ground potential Vss.

A disconnect circuit 18 includes an N-channel transistor (for example, an FET) and disconnects the sense amplifier 14 and a current amplifier 19 from local bit line LBL during a write operation.

For example, during a write operation, a control signal SE1 goes low and at this time the sense amplifier 14 and current amplifier 19 are disconnected from local bit line LBL. During a read operation, control signal SE1 goes high and at this time the sense amplifier 14 and current amplifier 19 are connected to local bit line LBL.

The sense amplifier (SA) 14 outputs potential $V_{out}$, which corresponds to data stored in the resistance change element in the memory cell MC, on the basis of sense current that flows through global read bit line GRBL and reference current that flows through a reference line RL. As will be described later, the sense amplifier 14 can be configured as a voltage sense type or a current sense type.

The current amplifier 19 includes a current mirror circuit (P-channel transistor) M and a voltage clamp transistor (P-channel transistor) Tc, which are connected between global read bit line GRBL and local bit line LBL. During a read operation, the current mirror circuit M amplifies cell current that flows through the resistance change element in the memory cell MC, and thus generates sense current. The power supply Vr of the current amplifier 19 is set at the power supply potential Vdd or a potential lower than potential Vdd.

The voltage clamp transistor Tc sets the potential of local bit line LBL during a read operation at a fixed potential. The control terminal (gate) of the voltage clamp transistor Tc is set at a clamp potential Vclamp.

(Second Embodiment)

FIG. 4 illustrates a hierarchical bit line structure according to a second embodiment.

Like the hierarchical bit line structure according to the first embodiment, the hierarchical bit line structure according to the second embodiment also relates to a one-cell-one-bit structure in which one bit is stored in one memory cell MC. As compared with the first embodiment, the second embodiment has a feature in embodying the structure of a reference cell that generates a reference potential.

The structure of memory cells in the second embodiment is the same as that in the first embodiment and thus its description is omitted. In the second embodiment, the structure of a reference cell will chiefly be described.

A plurality of blocks MAT0 to MAT7 include reference cells RC. The reference cells RC include resistance change elements, for example, magnetic resistance change elements. When a resistance change element in a memory cell MC has one of first and second resistances, a resistance change element in a reference cell RC has a resistance between the first and second resistances.

The reference cells RC may include select transistors (for example, an FET) connected in series to the resistance change elements.

Like the memory cells MC, the reference cells RC are selected by word lines WL and column select lines CSL.

Reference global read bit lines GRBL' and bGRBL' and reference global bit lines GEL' extend in the column direction on the block array 10. One end of reference global read bit line GRBL' is connected to the sense amplifier 14. One end of reference global read bit line bGRBL' and one of the reference global bit line GBL' are connected to the read/write control circuit 21.

Reference local bit lines LBL' and bLBL' are arranged in the plurality of blocks MAT0 to MAT7 and extend in the column direction. The reference cells RC are connected between reference local bit lines LBL' and bLBL'. More specifically, when the resistance change elements in the reference cells RC are two-terminal elements, the resistance change elements are connected between reference local bit lines LBL' and bLBL'.

The sense amplifier 14 reads data from the memory cells MC on the basis of sense current that flows through global read bit line GRBL and reference current that flows through reference global read bit line GRBL'.

It is desirable that the load capacity of global read bit lines GRBL and bGRBL and that of reference global read bit lines GRBL' and bGRBL' are substantially equal to each other.

The reason for the above is as follows. Latency can be shortened by making a speed required until the sense current that flows through global read bit line GRBL is saturated and a speed required until the reference current that flows through reference global read bit line GRBL' is saturated substantially equal to each other (see FIG. 30).

Peripheral circuits (Peri) 16 are connected between reference local bit lines LBL' and bLBL' and between reference global read bit lines GRBL' and bGRBL'. The peripheral circuits 16 are each located between adjacent two of blocks MAT0 to MAT7 or close to a corresponding one of the blocks.

FIGS. 5 and 6 each illustrate an example of the peripheral circuits 16 of FIG. 4.

FIG. 5 illustrates an example of a peripheral circuit 16 connected to a memory cell MC. The peripheral circuit 16 of FIG. 5 differs from that of FIG. 3 only in that the sense amplifier 14 is connected to global read bit line GRBL and reference global read bit line GRBL'.

In the other points, the peripheral circuit 16 of FIG. 5 is the same as that of FIG. 3 and thus their descriptions are omitted.

FIG. 6 illustrates an example of a peripheral circuit 16 connected to a reference cell RC.

The column select circuit 12 includes transfer gates connected to reference local bit lines LBL' and bLBL'. In this example, the transfer gates include an N-channel transistor (for example, an FET) and a P-channel transistor (for example, an FET). However, the transfer gates may include an N-channel transistor only.

The transfer gates in the column select circuit 12 are turned on when a column select signal CSL goes high.

A write driver 13 is connected between the reference global bit line GBL' and reference local bit line LBL'. The write driver 13 includes an inverter or a buffer, and becomes active (operative) during a write operation and becomes inactive (inoperative) during a read operation.

The active and inactive states are controlled by a control signal ACT. For example, the write driver 13 becomes active when control signal ACT is high and it becomes inactive when control signal ACT is low.

A read/write driver 13' is connected between reference global read bit line bGRBL' and reference local bit line bLBL'. The read/write driver 13' includes an inverter or a buffer.

When data is read from a resistance change element in a reference cell RC, the read/write control circuit 21 controls the read/write driver 13' such that the write driver 13 is made inactive and reference local bit line bLBL' is set at a fixed potential, such as ground potential Vss and a power supply potential Vdd.

When data is written to the resistance change element in the reference cell RC, the read/write control circuit 21 controls the write driver 13 and the read/write driver 13' such that one of reference local bit lines LBL' and bLBL' is set at a high potential, such as a power supply potential Vdd and the other is set at a potential lower than the high potential, such as ground potential Vss.

A discharge circuit 17 is connected to reference local bit lines LBL' and bLBL' and resets the potentials of these reference local bit lines LBL' and bLBL'. For example, when a control signal DIS goes high, reference local bit lines LBL' and bLBL' are set at the ground potential Vss.

A disconnect circuit 18 includes an N-channel transistor (for example, an FET) and disconnects the sense amplifier 14 and a current amplifier 19 from reference local bit line LBL' during a write operation.

For example, during a write operation, a control signal SE1 goes low and at this time the sense amplifier 14 and current amplifier 19 are disconnected from reference local bit line LBL'. During a read operation, control signal SE1 goes high and at this time the sense amplifier 14 and current amplifier 19 are connected to reference local bit line LBL'.

The sense amplifier 14 outputs potential $V_{out}$, which corresponds to data stored in the resistance change element in the memory cell MC, on the basis of sense current that flows through global read bit line GRBL and reference current that flows through reference global read bit line GRBL'. As will be described later, the sense amplifier 14 can be configured as a voltage sense type or a current sense type.

The current amplifier 19 includes a current mirror circuit (P-channel transistor) M and a voltage clamp transistor (P-channel transistor) Tc, which are connected between reference global read bit line GRBL' and reference local bit line LBL'. During a read operation, the current mirror circuit M amplifies cell current that flows through the resistance change element in the reference cell RC, and generates reference current. The power supply Vr of the current amplifier 19 is set at the power supply potential Vdd or a potential lower than potential Vdd.

The voltage clamp transistor Tc sets the potential of reference local bit line LBL' during a read operation at a fixed potential. The control terminal (gate) of the voltage clamp transistor Tc is set at a clamp potential Vclamp.

(Structure of Sense Amplifier)

Figure 8:
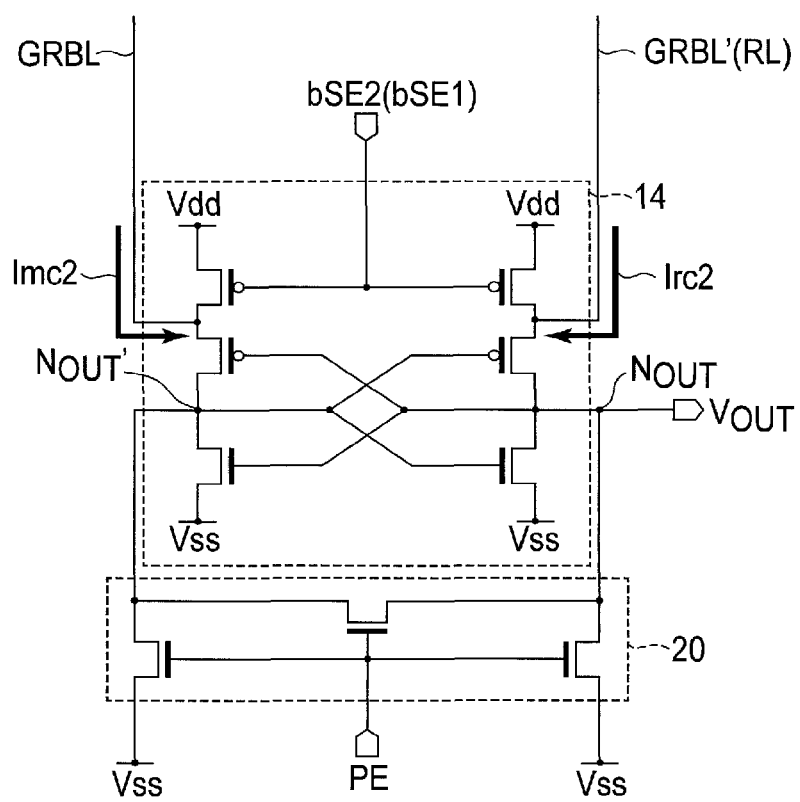
FIG. 8 is a diagram showing an example of a current read sense amplifier.

FIGS. 7 and 8 each illustrate an example of a sense amplifier that is applicable to the resistance change memories of FIGS. 1-6.

FIG. 7 illustrates a sense amplifier 14 of a voltage sense type.

When a control signal bSE2 is low, the sense amplifier 14 becomes active. In this example, before the sense amplifier 14 becomes active, too, the sense amplifier 14 is able to evaluate potential $V_{GRBL}$ of global read bit line GRBL and potential $V_{GRBL'}$ of reference global read bit line GRBL' (or the potential of the reference line RL) by the N-channel transistor (for example, an FET) in the sense amplifier 14.

When the sense amplifier 14 is activated, it outputs potential $V_{OUT}$, which corresponds to data of the memory cells MC shown in FIGS. 1-6, on the basis of sense current Imc2 that flows through global read bit line GRBL and reference current Irc2 that flows through reference global read bit line GRBL' (or reference line RL).

When the sense amplifier 14 is activated, a latch circuit, which is configured by the P-channel transistor (for example, an FET) and the N-channel transistor (for example, an FET) in the sense amplifier 14, latches data of the memory cells MC shown in FIGS. 1-6.

Before sense current Imc2 and reference current Irc2 are caused to flow through global read bit line GRBL and reference global read bit line GRBL', respectively, a precharge/equalization circuit 20 sets potential $V_{GRBL}$ of global read bit line GRBL and potential $V_{GRBL'}$ of reference global read bit line GRBL' (or the potential of the reference line RL) at, for example, the ground potential Vss in response to a control signal PE.

FIG. 8 illustrates a sense amplifier 14 of a current sense type.

When control signal bSE2 is low, the sense amplifier 14 becomes active. In this example, when the sense amplifier 14 becomes active, it outputs potential $V_{out}$, which corresponds to data of the memory cells MC shown in FIGS. 1-6, on the basis of sense current Imc2 that flows through global read bit line GRBL and reference current Irc2 that flows through reference global read bit line GRBL' (or reference line RL).

When the sense amplifier 14 is activated, a latch circuit, which is configured by the P-channel transistor (for example, an FET) and the N-channel transistor (for example, an FET) in the sense amplifier 14, latches data of the memory cells MC shown in FIGS. 1-6. The potential of a node $N_{OUT}$ corresponds to the output potential $V_{OUT}$.

Before sense current Imc2 and reference current Irc2 are caused to flow through global read bit line GRBL and reference global read bit line GRBL', respectively, a precharge/equalization circuit 20 sets two nodes $N_{OUT}$ and $N_{OUT'}$ of the latch circuit at, for example, the ground potential Vss in response to a control signal PE.

(Read Operation)

FIG. 9 illustrates an example of a read operation.

In this example, the sense amplifier (voltage sense type) 14 of FIG. 7 is applied to the resistance change memories illustrated in FIGS. 4-6. The operation waveforms of the read operation are illustrated in FIG. 28.

First, when a precharge/equalization signal PE is high, potential $V_{GRBL}$ of global read bit line GRBL and potential $V_{GRBL'}$ of reference global read bit line GRBL' are each set at the ground potential Vss. Then, at time t1, the precharge/equalization signal PE goes low.

At time t2, when a control signal SE1 goes high and a column select line CSL goes high, local bit line LBL and global read bit line GRBL are electrically connected to each other through a current amplifier 19 and reference local bit line LBL' and reference global read bit line GRBL' are electrically connected to each other through a current amplifier 19.

At time t3, when a word line WL goes high, cell current $|I_{LBL}|$ (corresponding to Imc1 of FIG. 9) which corresponds to the resistance of the resistance change element in the memory cell MC flows through local bit line LBL, and sense current $|I_{GRBL}|$ (corresponding to Imc2 of FIG. 9), which is obtained by amplifying cell current $|I_{LBL}|$ by the current amplifier 19, flows through global read bit line GRBL.

Similarly, a cell current (corresponding to Irc1 of FIG. 9) which corresponds to the resistance of the resistance element in the reference cell RC flows through reference local bit line LBL', and sense current $|I_{ref}|$ (corresponding to Imc2 of FIG. 9), which is obtained by amplifying the cell current by the current amplifier 19, flows through reference global read bit line GRBL'.

The resistance element in the reference cell RC illustrated in FIG. 9 has a resistance (for example, an intermediate value) between a 0-state resistance and a 1-state resistance of the resistance change element in the memory cell MC.

As illustrated in FIG. 9, according to this example, the sense amplifier 14 is of a type in which data of the memory cell MC is sensed based on sense currents Imc2 and Irc2 that flow into the sense amplifier 14.

Therefore, in the read operation, for example, the power supply Vr of the current amplifier 19 is set at the power supply potential (plus potential) Vdd, and the potential of global read bit line bGRBL and the potential of reference global read bit line bGRBL' are each made high by the read/write control circuit 21 illustrated in FIGS. 4-6.

In this case, the potential of local bit line bLBL and the potential of reference local bit line bLBL' are each set at the ground potential Vss by the read/write driver 13'.

Thus, cell current Imc1 flows from the current amplifier 19 to the memory cell MC and sense current Imc2 flows from the current amplifier 19 to the sense amplifier 14.

Similarly, cell current Irc1 flows from the current amplifier 19 to the reference cell RC and reference current Irc2 flows from the current amplifier 19 to the sense amplifier 14.

At time t4, when a control signal SE2 goes high, the sense amplifier 14 is activated and thus data of the memory cell MC, or a difference between potential $V_{GRBL}$ of global read bit line GRBL and potential $V_{GRBL'}$ of reference global read bit line GRBL' is latched in the sense amplifier 14.

Thus, the output potential $V_{OUT}$ of the sense amplifier 14 is output as valid data indicative of data of the memory cell MC.

At time t5, control signals SE1 and SE2 and column select line CSL are each made low and at time t6, the word line WL is made low to complete the read operation.

(Write Operation)

FIG. 10 illustrates an example of a write operation.

The example of FIG. 10 is directed to a write operation of the resistance change memories illustrated in FIGS. 4-6.

In the write operation, a control signal SE1 is made low in FIGS. 5 and 6, for example. Accordingly, the sense amplifier 14 and current amplifier 19 are disconnected from local bit line LBL by the disconnect circuit 18.

When a column select signal CSL goes high, local bit line LBL and the global bit line GBL are connected to each other, and local bit line bLBL and global read bit line bGRBL are connected to each other.

When a control signal ACT goes high, the write driver 13 becomes active (operative).

FIG. 10 illustrates an equivalent circuit of this state.

When binary 0 is written to the memory cell MC, or when the resistance of the resistance change element in the memory cell MC becomes low, the read/write control circuit 21 controls the write driver 13 to set local bit line LBL at a high potential, such as the power supply potential Vdd.

More specifically, the read/write control circuit 21 makes the potential of the global bit line GBL low. Then, the write driver 13 outputs a high signal and thus local bit line LBL is set at a high potential.

When binary 0 is written to the memory cell MC, the read/write control circuit 21 controls the read/write driver 13' to set local bit line bLBL at a low potential, such as the ground potential Vss.

More specifically, the read/write control circuit 21 makes the potential of global read bit line bGRBL high. Then, the read/write driver 13' outputs a low signal and thus local bit line bLBL is set at a low potential.

Therefore, when binary 0 is written to the memory cell MC, write current Iw, which flows from local bit line LBL to local bit line bLBL, flows through the resistance change element in the memory cell MC.

When binary 1 is written to the memory cell MC, or when the resistance of the resistance change element in the memory cell MC becomes high, the read/write control circuit 21 controls the write driver 13 to set local bit line LBL at a low potential, such as the ground potential Vss.

More specifically, the read/write control circuit 21 makes the potential of the global bit line GBL high. Then, the write driver 13 outputs a low signal and thus local bit line LBL is set at a low potential.

When binary 1 is written to the memory cell MC, the read/write control circuit 21 controls the read/write driver 13' to set local bit line bLBL at a high potential, such as the power supply potential Vdd.

More specifically, the read/write control circuit 21 makes the potential of global read bit line bGRBL low. Then, the read/write driver 13' outputs a high signal and thus local bit line bLBL is set at a high potential.

Therefore, when binary 1 is written to the memory cell MC, write current Iw, which flows from local bit line bLBL to local bit line LBL, flows through the resistance change element in the memory cell MC.

(Third Embodiment)

A third embodiment is directed to a modification to the type of the sense amplifier of the second embodiment.

The sense amplifier of the second embodiment is of a type in which data of a memory cell is sensed on the basis of sense current that flows into the sense amplifier. In contrast, the sense amplifier of the third embodiment is of a type in which data of a memory cell is sensed on the basis of sense current that flows from the sense amplifier.

The hierarchical bit line structure of the third embodiment is the same as that of the second embodiment (FIG. 4) and thus its descriptions are omitted.

FIGS. 11 and 12 each illustrate an example of the peripheral circuit 16 of FIG. 4.

FIG. 11 illustrates an example of a peripheral circuit 16 connected to a memory cell MC. The peripheral circuit 16 of FIG. 11 differs from that of FIG. 5 only in the structures of a disconnect circuit 18 and a current amplifier 19. In the other points, the peripheral circuit 16 of FIG. 11 is the same as that of FIG. 5 and thus their descriptions are omitted.

The disconnect circuit 18 includes an N-channel transistor (for example, an FET) and disconnects the sense amplifier 14 and current amplifier 19 from local bit line LBL during a write operation.

Since the disconnect circuit 18 is an N-channel transistor, it is controlled by a control signal SE1.

Control signal SE1 goes low during a write operation, for example and then the sense amplifier 14 and current amplifier 19 are disconnected from local bit line LBL. Control signal SE1 goes high during a read operation and then the sense amplifier 14 and current amplifier 19 are connected to local bit line LBL.

The sense amplifier 14 outputs potential $V_{out}$, which corresponds to data stored in the resistance change element in the memory cell MC, on the basis of sense current that flows through global read bit line GRBL and reference current that flows through reference global read bit line GRBL' (or reference line RL).

The current amplifier 19 includes a current mirror circuit (N-channel transistor) M and a voltage clamp transistor (for example, N-channel transistor) Tc, which are connected between global read bit line GRBL and local bit line LBL. During a read operation, the current mirror circuit M amplifies cell current that flows through the resistance change element in the memory cell MC, and thus generates sense current. The power supply Vr of the current amplifier 19 is set at, for example, the ground potential Vss.

The voltage clamp transistor Tc sets the potential of local bit line LBL during a read operation at a fixed potential. The control terminal (gate) of the voltage clamp transistor Tc is set at a clamp potential Vclamp.

FIG. 12 illustrates an example of a peripheral circuit 16 connected to a reference cell RC. The peripheral circuit 16 of FIG. 12 differs from that of FIG. 6 only in the structures of a disconnect circuit 18 and a current amplifier 19. In the other points, the peripheral circuit 16 of FIG. 12 is the same as that of FIG. 6 and thus their descriptions are omitted.

The disconnect circuit 18 includes an N-channel transistor (for example, an FET) and disconnects the sense amplifier 14 and current amplifier 19 from reference local bit line LBL' during a write operation.

Since the disconnect circuit 18 is an N-channel transistor, it is controlled by a control signal SE1.

Control signal SE1 goes low during a write operation, for example and then the sense amplifier 14 and current amplifier 19 are disconnected from reference local bit line LBL'. Control signal SE1 goes high during a read operation and then the sense amplifier 14 and current amplifier 19 are connected to reference local bit line LBL'.

The sense amplifier 14 outputs potential $V_{out}$, which corresponds to data stored in the resistance change element in the memory cell MC, on the basis of sense current that flows through global read bit line GRBL and reference current that flows through reference global read bit line GRBL'.

The current amplifier 19 includes a current mirror circuit (N-channel transistor) M and a voltage clamp transistor (for example, N-channel transistor) Tc, which are connected between reference global read bit line GRBL' and reference local bit line LBL'. During a read operation, the current mirror circuit M amplifies cell current that flows through the resistance change element in the reference cell RC, and thus generates reference current. The power supply Vr of the current amplifier 19 is set at, for example, the ground potential Vss.

The voltage clamp transistor Tc sets the potential of reference local bit line LBL' during a read operation at a fixed potential. The control terminal (gate) of the voltage clamp transistor Tc is set at a clamp potential Vclamp.

(Structure of Sense Amplifier)

FIGS. 13 and 14 each illustrate an example of a sense amplifier that is applicable to the resistance change memories of FIGS. 11 and 12.

FIG. 13 illustrates a sense amplifier 14 of a voltage sense type.

When a control signal SE2 is high, the sense amplifier 14 becomes active. In this example, before the sense amplifier 14 becomes active, too, the sense amplifier 14 is able to evaluate potential $V_{GRBL}$ of global read bit line GRBL and potential $V_{GRBL'}$ of reference global read bit line GRBL' (or the potential of the reference line RL) by the P-channel transistor (for example, an FET) in the sense amplifier 14.

When the sense amplifier 14 is activated, it outputs potential $V_{OUT}$, which corresponds to data of the memory cell MC shown in FIG. 11, on the basis of sense current Imc2 that flows through global read bit line GRBL and reference current Irc2 that flows through reference global read bit line GRBL' (or reference line RL).

When the sense amplifier 14 is activated, a latch circuit, which is configured by the P-channel transistor (for example, an FET) and the N-channel transistor (for example, an FET) in the sense amplifier 14, latches data of the memory cell MC shown in FIG. 11.

Before sense current Imc2 and reference current Irc2 are caused to flow through global read bit line GRBL and reference global read bit line GRBL', respectively, a pre-charge/equalization circuit 20 sets potential $V_{GRBL}$ of global read bit line GRBL and potential $V_{GRBL'}$ of reference global read bit line GRBL' (or the potential of the reference line RL) at, for example, the power supply potential Vdd in response to a control signal bPE.

Control signals bPE and bSE2 are inversion signals of control signals PE and SE2, respectively.

FIG. 14 illustrates a sense amplifier 14 of a current sense type.

When control signal SE2 is high, the sense amplifier 14 becomes active. In this example, when the sense amplifier 14 becomes active, it outputs potential $V_{out}$, which corresponds to data of the memory cell MC shown in FIG. 11, on the basis of sense current Imc2 that flows through global read bit line GRBL and reference current Irc2 that flows through reference global read bit line GRBL' (or reference line RL).

When the sense amplifier 14 is activated, a latch circuit, which is configured by the P-channel transistor (for example, an FET) and the N-channel transistor (for example, an FET) in the sense amplifier 14, latches data of the memory cell MC shown in FIG. 11. The potential of a node $N_{OUT}$ corresponds to the output potential $V_{OUT}$.

Before sense current Imc2 and reference current Irc2 are caused to flow through global read bit line GRBL and reference global read bit line GRBL', respectively, a pre-charge/equalization circuit 20 sets two nodes $N_{OUT}$ and $N_{OUT'}$ of the latch circuit at, for example, the power supply potential Vdd in response to a control signal bPE.

Control signals bPE and bSE2 are inversion signals of control signals PE and SE2, respectively. Control signal SE2 can be changed to a control signal SE1.

(Read Operation)

FIG. 15 illustrates an example of a read operation.

In this example, the sense amplifier (voltage sense type) 14 of FIG. 13 is applied to the resistance change memories illustrated in FIGS. 11 and 12. The operation waveforms of the read operation are illustrated in FIG. 28.

First, when a precharge/equalization signal PE is high, or a precharge/equalization signal bPE is low, potential $V_{GRBL}$ of global read bit line GRBL and potential $V_{GRBL'}$ of reference global read bit line GRBL' are each set at the power supply potential Vdd. Then, at time t1, the precharge/equalization signal PE goes low (the precharge/equalization signal bPE goes high).

At time t2, when a control signal SE1 goes high (a control signal bSE1 goes low) and a column select line CSL goes high, local bit line LBL and global read bit line GRBL are electrically connected to each other through a current amplifier 19 and reference local bit line LBL' and reference global read bit line GRBL' are electrically connected to each other through a current amplifier 19.

At time t3, when a word line WL goes high, cell current $|I_{LBL}|$ (corresponding to Imc1 of FIG. 15) which corresponds to the resistance of the resistance change element in the memory cell MC flows through local bit line LBL, and sense current $|I_{GRBL}|$ (corresponding to Imc2 of FIG. 15), which is obtained by amplifying cell current $|I_{LBL}|$ by the current amplifier 19, flows through global read bit line GRBL.

Similarly, a cell current (corresponding to Irc1 of FIG. 15) which corresponds to the resistance of the resistance element in the reference cell RC flows through reference local bit line LBL', and sense current $|I_{ref}|$ (corresponding to Imc2 of FIG. 15), which is obtained by amplifying the cell current by the current amplifier 19, flows through reference global read bit line GRBL'.

The resistance element in the reference cell RC illustrated in FIG. 15 has a resistance (for example, an intermediate value) between a 0-state resistance and a 1-state resistance of the resistance change element in the memory cell MC.

As illustrated in FIG. 15, according to this example, the sense amplifier 14 is of a type in which data of the memory cell MC is sensed based on sense currents Imc2 and Irc2 that flow from the sense amplifier 14.

Therefore, in the read operation, for example, the power supply Vr of the current amplifier 19 is set at the ground potential Vss, and the potential of global read bit line bGRBL and the potential of reference global read bit line bGRBL' are each made low by the read/write control circuit 21 illustrated in FIGS. 11 and 12.

In this case, the potential of local bit line bLBL and the potential of reference local bit line bLBL' are each set at the power supply potential Vdd by the read/write driver 13'.

Thus, cell current Imc1 flows from the memory cell MC to the current amplifier 19 and sense current Imc2 flows from the sense amplifier 14 to the current amplifier 19. Similarly, cell current Irc1 flows from the reference cell RC to the current amplifier 19 and reference current Irc2 flows from the sense amplifier 14 to the current amplifier 19.

At time t4, when a control signal SE2 goes high, the sense amplifier 14 is activated and thus data of the memory cell MC, or a difference between potential $V_{GRBL}$ of global read bit line GRBL and potential $V_{GRBL'}$ of reference global read bit line GRBL' is latched in the sense amplifier 14.

Thus, the output potential $V_{OUT}$ of the sense amplifier 14 is output as valid data indicative of data of the memory cell MC.

At time t5, control signals SE1 and SE2 and column select line CSL are each made low and at time t6, the word line WL is made low to complete the read operation.

(Write Operation)

FIG. 16 illustrates an example of a write operation.

The example of FIG. 16 is directed to a write operation of the resistance change memories illustrated in FIGS. 11 and 12.

In the write operation, a control signal SE1 is made low (a control signal bSE1 is made high) in FIGS. 11 and 12, for example. Accordingly, the sense amplifier 14 and current amplifier 19 are disconnected from local bit line LBL by the disconnect circuit 18.

When a column select signal CSL goes high, local bit line LBL and the global bit line GBL are connected to each other, and local bit line bLBL and global read bit line bGRBL are connected to each other.

When a control signal ACT goes high, the write driver 13 becomes active (operative).

FIG. 16 illustrates an equivalent circuit of this state.

When binary 0 is written to the memory cell MC, or when the resistance of the resistance change element in the memory cell MC becomes low, the read/write control circuit 21 controls the write driver 13 to set local bit line LBL at a high potential, such as the power supply potential Vdd.

More specifically, the read/write control circuit 21 makes the potential of the global bit line GBL low. Then, the write driver 13 outputs a high signal and thus local bit line LBL is set at a high potential.

When binary 0 is written to the memory cell MC, the read/write control circuit 21 controls the read/write driver 13' to set local bit line bLBL at a low potential, such as the ground potential Vss.

More specifically, the read/write control circuit 21 makes the potential of global read bit line bGRBL high. Then, the read/write driver 13' outputs a low signal and thus local bit line bLBL is set at a low potential.

Therefore, when binary 0 is written to the memory cell MC, write current Iw, which flows from local bit line LBL to local bit line bLBL, flows through the resistance change element in the memory cell MC.

When binary 1 is written to the memory cell MC, or when the resistance of the resistance change element in the memory cell MC becomes high, the read/write control circuit 21 controls the write driver 13 to set local bit line LBL at a low potential, such as the ground potential Vss.

More specifically, the read/write control circuit 21 makes the potential of the global bit line GBL high. Then, the write driver 13 outputs a low signal and thus local bit line LBL is set at a low potential.

When binary 1 is written to the memory cell MC, the read/write control circuit 21 controls the read/write driver 13' to set local bit line bLBL at a high potential, such as the power supply potential Vdd.

More specifically, the read/write control circuit 21 makes the potential of global read bit line bGRBL low. Then, the read/write driver 13' outputs a high signal and thus local bit line bLBL is set at a high potential.

Therefore, when binary 1 is written to the memory cell MC, write current Iw, which flows from local bit line bLBL to local bit line LBL, flows through the resistance change element in the memory cell MC.

(Fourth Embodiment)

A fourth embodiment is directed to the layout of the peripheral circuits of the first to third embodiments.

FIG. 17 shows an example of the layout of the peripheral circuits.

Peripheral circuits 16a and 16b are arranged at their respective ends of a block MAT in the column direction. In other words, the block MAT is provided between the peripheral circuits 16a and 16b.

The block MAT includes a plurality of sets, for example, 256 sets. Each of the sets corresponds to, for example, M (natural number) pairs of local bit lines LBL and bLBL. M is, for example, eight. Each of the sets also corresponds to one pair of global read bit lines GRBL and bGRBL.

A plurality of local bit lines LBL are connected to the peripheral circuit 16a. The peripheral circuit 16a includes a column select circuit through which one of local bit lines LBL is connected to its corresponding global read bit line GRBL.

A plurality of local bit lines bLBL are connected to the peripheral circuit 16b. The peripheral circuit 16b includes a column select circuit through which one of local bit lines bLBL is connected to its corresponding global read bit line bGRBL.

The peripheral circuit 16a connected to local bit lines LBL and the peripheral circuit 16b connected to local bit lines bLBL can be separated from each other.

FIG. 18 is a circuit diagram showing an embodied one of the layout of FIG. 17.

The block array 10 includes eight blocks MAT0 to MAT7. Each of the blocks includes 256 sets. Each of the sets corresponds to eight columns and in other words, it includes eight local bit line pairs. One of the eight columns is selected by column select signals OSLO to CSL7.

In FIG. 18, a write driver 13, a read/write driver 13' and a current amplifier 19 respectively correspond to the write drivers, read/write drivers and current amplifiers in the first to third embodiments.

(Fifth Embodiment)

Figure 19:
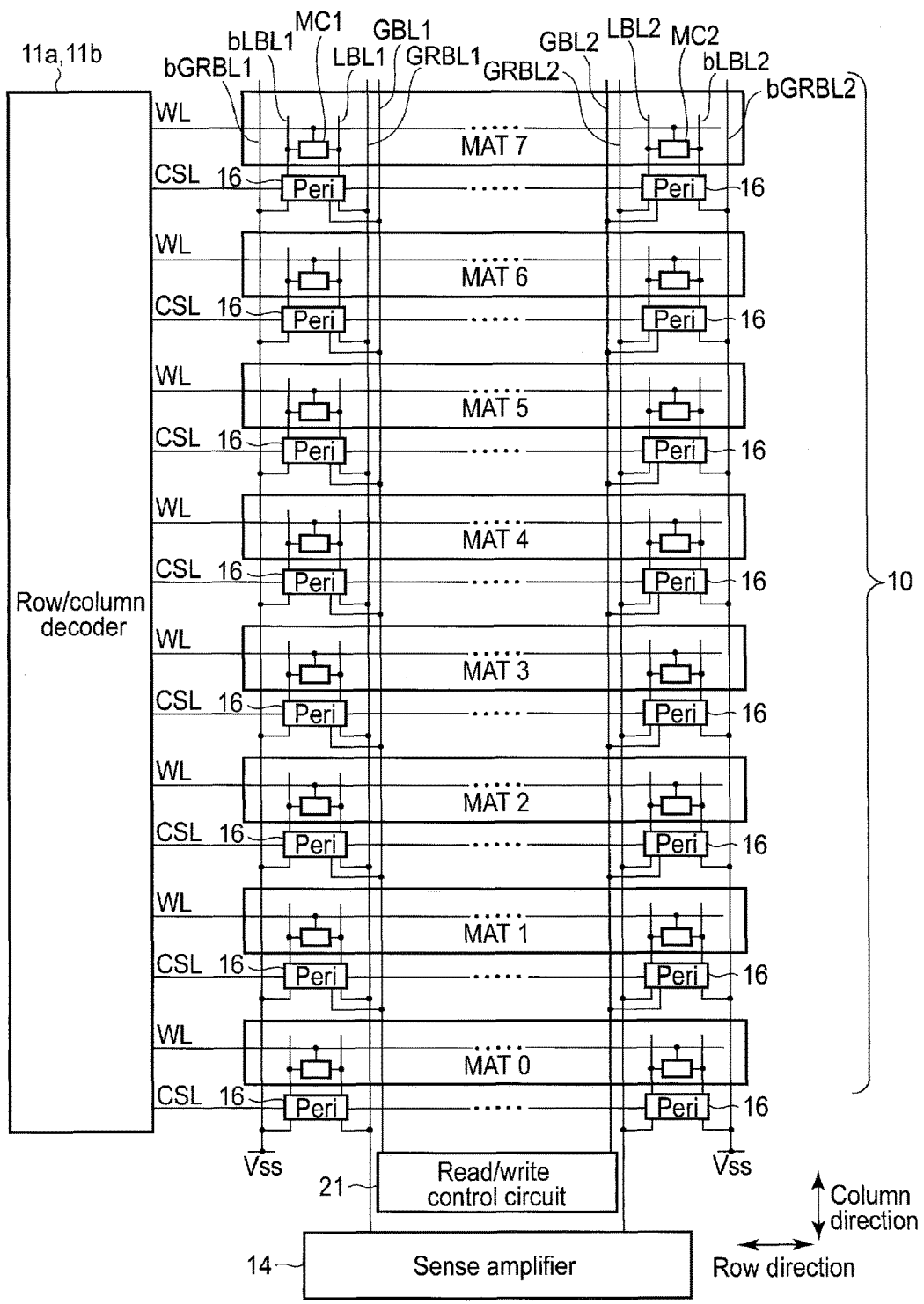

FIG. 19 illustrates a hierarchical bit line structure according to a fifth embodiment.

The fifth embodiment is directed to a two-cell-one-bit structure in which one bit is stored in two memory cells MC1 and MC2. The fifth embodiment differs from the second embodiment in that complementary data (high resistance/low resistance) is stored in the two memory cells MC1 and MC2.

A memory cell MC1, local bit lines LBL1 and bLBL1, global read bit lines GRBL1 and bGRBL1, a global bit line GBL1 and a peripheral circuit 16 in FIG. 19 respectively corresponds to the memory cell MC, local bit lines LBL and bLBL, global read bit lines GRBL and bGRBL, global bit line GBL and peripheral circuit 16 in the second embodiment (FIGS. 4-10).

Similarly, a memory cell MC2, local bit lines LBL2 and bLBL2, global read bit lines GRBL2 and bGRBL2, a global bit line GBL2 and a peripheral circuit 16 in FIG. 19 respectively corresponds to the memory cell MC, local bit lines LBL and bLBL, global read bit lines GRBL and bGRBL, global bit line GBL and peripheral circuit 16 in the second embodiment (FIGS. 4-10).

Furthermore, row column decoders 11e and 11b, a sense amplifier 14 and a read/write control circuit 21 in FIG. 19 respectively correspond to the row/column decoders 11a and 11b, sense amplifier 14 and read/write control circuit 21 in the second embodiment (FIGS. 4-10).

In the fifth embodiment, however, the sense amplifier 14 compares sense current that flows through global read bit line GRBL1 and sense current that flows through global read bit line GRBL2, and reads data (one bit) from the two memory cells MC1 and MC2.

Therefore, the fifth embodiment includes no equivalents for the reference cell RC, reference local bit lines LBL' and bLBL', reference global read bit lines GRBL' and bGRBL' and reference global bit line GBL' of the second embodiment.

In the fifth embodiment, the two memory cells MC1 and MC2 that store complementary data need not be included in the same block.

In the example of FIG. 19, the two memory cells MC1 and MC2 that store complementary data (one bit) are included in the same block, for example, block MAT7. Instead of this, as shown in FIG. 20, two memory cells MC1 and MC2 that store complementary data (one bit) can be included in different two blocks.

As illustrated in FIG. 20, complementary data is stored in a memory cell MC1 in a block MAT03 and a memory cell MC2 in a block MAT13.

(Structure of Sense Amplifier)

FIGS. 21 and 22 each illustrate an example of a sense amplifier that is applicable to the resistance change memories of FIGS. 19 and 20.

FIG. 21 illustrates a sense amplifier 14 of a voltage sense type.

As compared with the sense amplifier of FIG. 7, the sense amplifier 14 of FIG. 21 has a feature in outputting potential $V_{OUT}$ corresponding to data of memory cells MC1 and MC2 on the basis of sense current Imc12 that flows through global read bit line GRBL1 and sense current Imc22 that flows through global read bit line GRBL2.

The operation of the sense amplifier 14 is the same as that of the sense amplifier of FIG. 7 and thus its descriptions are omitted here.

FIG. 22 illustrates a sense amplifier 14 of a current sense type.

As compared with the sense amplifier of FIG. 8, the sense amplifier 14 of FIG. 22 has a feature in outputting potential $V_{OUT}$ corresponding to data of memory cells MC1 and MC2 on the basis of sense current Imc12 that flows through global read bit line GRBL1 and sense current Imc22 that flows through global read bit line GRBL2.

The operation of the sense amplifier 14 is the same as that of the sense amplifier of FIG. 8 and thus its descriptions are omitted here.

(Read Operation)

FIG. 23 illustrates an example of a read operation.

In this example, the sense amplifier (voltage sense type) 14 of FIG. 21 is applied to the resistance change memory illustrated in FIG. 19. The operation waveforms of the read operation are illustrated in FIG. 29.

First, when a precharge/equalization signal PE is high, potential $V_{GRBL1}$ of global read bit line GRBL1 and potential $V_{GRBL2}$ of global read bit line GRBL2 are each set at the ground potential Vss. Then, at time t1, the precharge/equalization signal PE goes low.

At time t2, when a control signal SE1 goes high and a column select line CSL goes high, local bit line LBL1 and global read bit line GRBL1 are electrically connected to each other through a current amplifier 19 and local bit line LBL2 and global read bit line GRBL2 are electrically connected to each other through a current amplifier 19.

At time t3, when a word line WL goes high, cell current $|I_{LBL1}|$ (corresponding to Imc11 of FIG. 23) which corresponds to the resistance of the resistance change element in memory cell MC1 flows through local bit line LBL1, and sense current $|I_{GRBL1}|$ (corresponding to Imc12 of FIG. 9), which is obtained by amplifying cell current $|I_{LBL1}|$ by the current amplifier 19, flows through global read bit line GRBL1.

Similarly, cell current $|I_{LBL2}|$ (corresponding to Imc21 of FIG. 23) which corresponds to the resistance of the resistance change element in memory cell MC2 flows through local bit line LBL2, and sense current $|I_{GRBL2}|$ (corresponding to Imc22 of FIG. 9), which is obtained by amplifying cell current $|I_{LBL2}|$ by the current amplifier 19, flows through global read bit line GRBL2.

As illustrated in FIG. 23, according to this example, the sense amplifier 14 is of a type in which data of memory cell MC2 is sensed based on sense currents Imc12 and Imc22 that flow into the sense amplifier 14.

Therefore, in the read operation, for example, the power supply Vr of the current amplifier 19 is set at the power supply potential (plus potential) Vdd, and the potentials of global read bit lines bGRBL1 and bGRBL2 are each made high by the read/write control circuit 21 illustrated in FIG. 19.

In this case, the potentials of local bit lines bLBL1 and bLBL2 are each set at the ground potential Vss by the read/write driver 13'.

Thus, cell current Imc11 flows from the current amplifier 19 to memory cell MC1 and sense current Imc12 flows from the current amplifier 19 to the sense amplifier 14. Similarly, cell current Imc21 flows from the current amplifier 19 to memory cell MC2 and sense current Imc22 flows from the current amplifier 19 to the sense amplifier 14.

At time t4, when a control signal SE2 goes high, the sense amplifier 14 is activated and thus data of memory cells MC1 and MC2, or a difference between potential $V_{GRBL1}$ of global read bit line GRBL1 and potential $V_{GRBL2}$ of global read bit line GRBL2 is latched in the sense amplifier 14.

Thus, the output potential $V_{OUT}$ of the sense amplifier 14 is output as valid data indicative of data (complementary data) stored in memory cells MC1 and MC2.

At time t5, control signals SE1 and SE2 and column select line CSL are each made low and at time t6, the word line WL is made low to complete the read operation.

(Write Operation)

The write operation of the fifth embodiment is the same as that of the second embodiment (see FIG. 10) and thus its descriptions are omitted here.

(Sixth Embodiment)

A sixth embodiment is directed to a modification to the sense amplifier of the fifth embodiment.

The sense amplifier of the fifth embodiment is of a type in which data of a memory cell is sensed based on sense current that flows into the sense amplifier. In contrast, the sense amplifier of the sixth embodiment is of a type in which data of a memory cell is sensed based on sense current that flows from the sense amplifier.

The hierarchical bit line structure of the sixth embodiment is the same as that of the fifth embodiment (FIGS. 19 and 20). The peripheral circuit of the sixth embodiment is the same as that of the third embodiment (FIGS. 11 and 12). Their descriptions are therefore omitted.

(Structure of Sense Amplifier)

FIG. 24 illustrates a sense amplifier 14 of a voltage sense type.

As compared with the sense amplifier of FIG. 13, the sense amplifier 14 of FIG. 24 has a feature in outputting potential $V_{OUT}$ corresponding to data of memory cells MC1 and MC2 on the basis of sense current Imc12 that flows through global read bit line GRBL1 and sense current Imc22 that flows through global read bit line GRBL2.

The operation of the sense amplifier 14 is the same as that of the sense amplifier of FIG. 13 and thus its descriptions are omitted.

FIG. 25 illustrates a sense amplifier 14 of a current sense type.

As compared with the sense amplifier of FIG. 14, the sense amplifier 14 of FIG. 25 has a feature in outputting potential $V_{OUT}$ corresponding to data of memory cells MC1 and MC2 on the basis of sense current Imc12 that flows through global read bit line GRBL1 and sense current Imc22 that flows through global read bit line GRBL2.

The operation of the sense amplifier 14 is the same as that of the sense amplifier of FIG. 14 and thus its descriptions are omitted here.

(Read Operation)

FIG. 26 illustrates an example of a read operation.

In this example, the sense amplifier (voltage sense type) 14 of FIG. 24 is applied to the resistance change memory illustrated in FIG. 19. The operation waveforms of the read operation are illustrated in FIG. 29.

First, when a precharge/equalization signal PE is high, or a precharge/equalization signal bPE is low, potential $V_{GRBL1}$ of global read bit line GRBL1 and potential $V_{GRBL2}$ of global read bit line GRBL2 are each set at the power supply potential Vdd. Then, at time t1, the precharge/equalization signal PE goes low (the precharge/equalization signal bPE goes high).

At time t2, when a control signal SE1 goes high (a control signal bSE1 goes low) and a column select line CSL goes high, local bit line LBL1 and global read bit line GRBL1 are electrically connected to each other through a current amplifier 19 and local bit line LBL2 and global read bit line GRBL2 are electrically connected to each other through a current amplifier 19.

At time t3, when a word line WL goes high, cell current $|I_{LBL1}|$ (corresponding to Imc11 of FIG. 26) which corresponds to the resistance of the resistance change element in memory cell MC1, flows through local bit line LBL1, and sense current $|I_{GRBL1}|$ (corresponding to Imc12 of FIG. 26), which is obtained by amplifying cell current $|I_{LBL1}|$ by the current amplifier 19, flows through global read bit line GRBL1.

Similarly, cell current $|I_{LBL2}|$ (corresponding to Imc21 of FIG. 26) which corresponds to the resistance of the resistance change element in memory cell MC2 flows through local bit line LBL2, and sense current $|I_{GRBL2}|$ (corresponding to Imc22 of FIG. 26), which is obtained by amplifying cell current $|I_{LBL2}|$ by the current amplifier 19, flows through global read bit line GRBL2.

As illustrated in FIG. 26, according to this example, the sense amplifier 14 is of a type in which data of memory cells MC1 and MC2 is sensed based on sense currents Imc12 and Imc22 that flow from the sense amplifier 14.

Therefore, in the read operation, for example, the power supply Vr of the current amplifier 19 is set at the ground potential Vss, and the potential of global read bit line bGRBL1 and the potential of global read bit line bGRBL2 are each made low by the read/write control circuit 21 illustrated in FIG. 19.

In this case, the potential of local bit line bLBL1 and the potential of local bit line bLBL2 are each set at the power supply potential Vdd by the read/write driver 13'.

Thus, cell current Imc11 flows from memory cell MC1 to the current amplifier 19 and sense current Imc12 flows from the sense amplifier 14 to the current amplifier 19. Similarly, cell current Imc21 flows from memory cell MC2 to the current amplifier 19 and sense current Imc22 flows from the sense amplifier 14 to the current amplifier 19.

At time t4, when a control signal SE2 goes high, the sense amplifier 14 is activated and thus data of memory cells MC1 and MC2, or a difference between potential $V_{GRBL1}$ of global read bit line GRBL1 and potential $V_{GRBL2}$ of global read bit line GRBL2 is latched in the sense amplifier 14.

Thus, the output potential $V_{OUT}$ of the sense amplifier 14 is output as valid data indicative of data (complementary data) stored in memory cells MC1 and MC2.

At time t5, control signals SE1 and SE2 and column select line CSL are each made low and at time t6, the word line WL is made low to complete the read operation.

(Write Operation)

The write operation of the sixth embodiment is the same as that of the third embodiment (see FIG. 16) and thus its descriptions are omitted here.

(Seventh Embodiment)

A seventh embodiment is directed to the layout of the peripheral circuits of the fifth and sixth embodiments.

In the fifth and sixth embodiments, too, the layout of the peripheral circuits as described in the fourth embodiment (FIG. 17) can be employed.

FIG. 27 shows an example of the layout of the peripheral circuits.

The memory cell 10 includes eight blocks MAT0 to MAT7. Each of the blocks includes 256 sets. Each of the sets includes eight columns, or eight local bit line pairs. One of the eight columns is selected by column select signals CSL0 to CSL7.

In FIG. 7, a write driver 13, a read/write driver 13' and a current amplifier 19 respectively correspond to the write driver, read/write driver and current amplifier in the fifth and sixth embodiments.

(Eighth Embodiment)

An eight embodiment relates to adjustment of load capacity.

Figure 30:
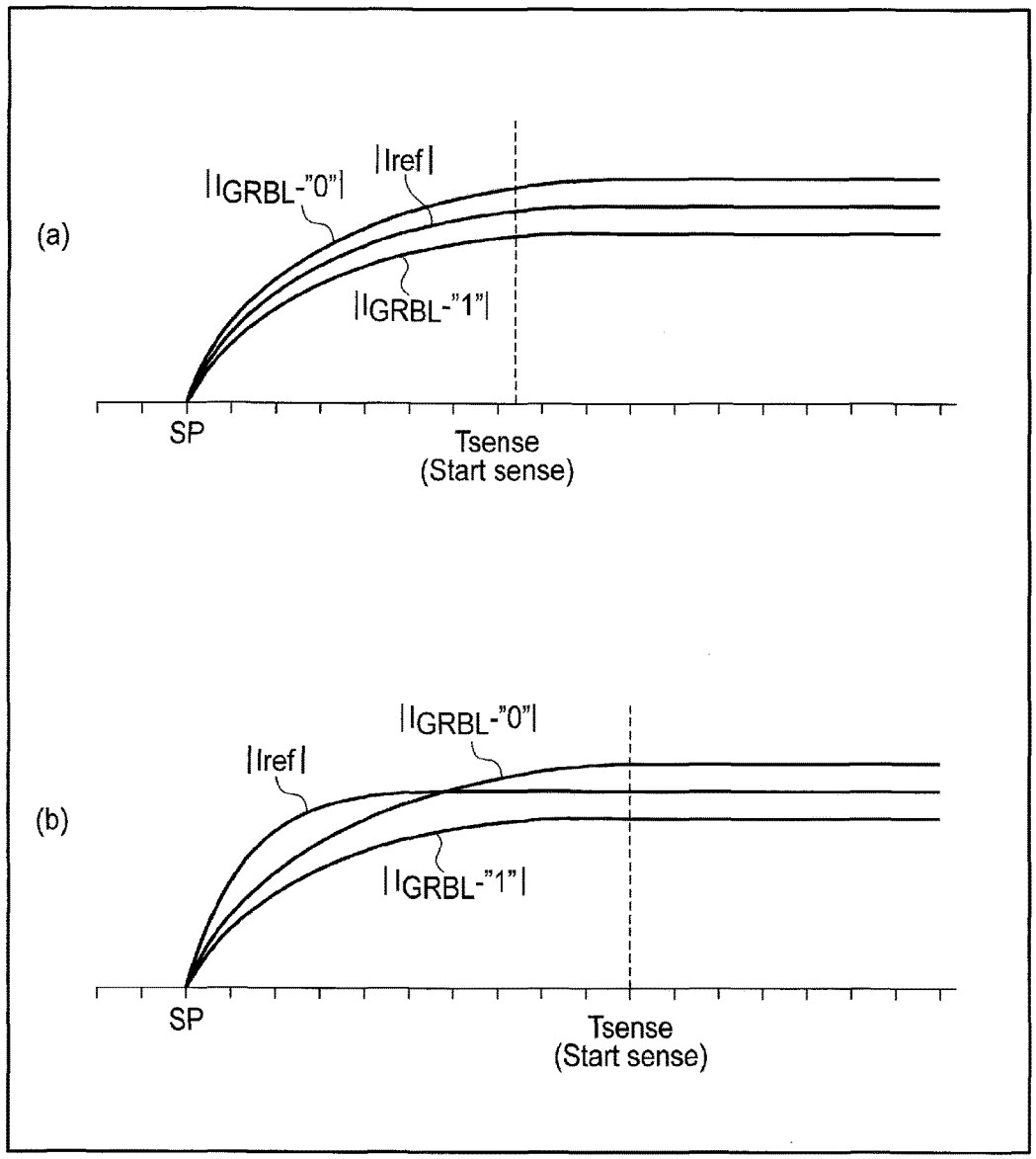
FIG. 30 is a chart showing an example of shortening sense time by adjusting load capacity.

FIG. 30 shows an example of shortening sense time by adjusting load capacity.

In the foregoing second and third embodiment, namely, in the example where one bit is stored in one memory cell (FIGS. 4-18), the load capacity of global read bit line GRBL and that of reference global read bit line GRBL' are substantially equal to each other.

As shown in (a) of FIG. 30, therefore, the reference current $|Iref|$ (corresponding to Irc2) is always located between sense current $|I_{GRBL}-1|$ (corresponding to Imc2) which corresponds to a memory cell MC in a high-resistance state (1-state) and sense current $|I_{GRBL}-0|$ (corresponding to Imc2) which corresponds to a memory cell MC in a low-resistance state (0-state) after a point in time SP at which current is started to flow into the memory cell MC and reference cell RC.

Thus, a sense start point Tsense need not be extended until reference current |Iref| and sense currents $|I_{GRBL}-0|$ and $|I_{GRBL}-1|$ are saturated, with the result that sense time can be shortened and accordingly latency can be shortened.

In contrast, for example, when the load capacity of reference global read bit line GRBL' is extremely small, reference current |Iref| is saturated at once, whereas sense currents $|I_{GRBL}-0|$ and $|I_{GRBL}-1|$ are not saturated easily, as shown in (b) of FIG. 30.

Therefore, the sense start point Tsense needs to be extended until reference current |Iref| and sense currents $|I_{GRBL}-0|$ and $|I_{GRBL}-1|$ are saturated, namely, until reference current |Iref| is set with a sufficient margin between sense current $|I_{GRBL}-1|$ which corresponds to a memory cell MC in a high-resistance state (1-state) and sense current $|I_{GRBL}-0|$ which corresponds to a memory cell MC in a low-resistance state (0-state).

To make the load capacity of global read bit line GRBL and that of reference global read bit line GRBL' substantially equal to each other in the second and third embodiments is a very effective means for improving high-speed access by the current amplifier more remarkably.

For the same reason as above, to make the load capacity of global read bit line GRBL1 and that of global read bit line GRBL2 substantially equal to each other in the fifth and sixth embodiments is considered to be effective in improving high-speed access by the current amplifier more remarkably.

(Summary)

In the resistance change memory having a hierarchical bit line structure according to each of the foregoing embodiments, cell current that flows through the memory cells is amplified to a considerably large sense current using a current amplifier connected between the local bit line and the global bit line.

FIG. 31 shows a relationship between the factor of current amplification and the increase ratio of area of the cells.

The increase ratio of area of the cells means the increase ratio of the area of a memory cell array to that of a memory cell array in a case where no current amplifier is provided (in a case where the factor of current amplification is 1).

As the factor of current amplification increases as shown in FIG. 31, the transistors in the current amplifier increase in size, as does the increase ratio of area of the memory cell array. However, when the range of the factor of current amplification is 1000 or less, the increase ratio of area of the memory cell array can be reduced to about 10% or less.

For example, when the factor of current amplification is set at 10 in a one-Mbyte memory cell array, a hierarchical bit line structure including a current amplifier can be achieved only by a 0.7% area overhead.

Therefore, when one-microampere sense current comparable to the sense current of an SRAM is required, the cell current that is caused to flow through the memory cells can be set within the range of several to several hundreds of nanoamperes.

In other words, even though, for example, the cell current is decreased to about 1 μA during a write operation as in a perpendicular magnetization STT-MRAM, a read disturbance can be prevented if the cell current is set at no greater than several hundreds of nanoamperes during a read operation.

Furthermore, a high-speed read operation (1 to 10 ns) can be achieved by amplifying the cell current of several to several hundreds of nanoamperes to 1 μA.

In the foregoing embodiments, the read operation can be performed at higher speed by duplicating the sense amplifier as illustrated in FIGS. 32 and 33. These figures illustrate a two-cell-one-bit structure, or an example of sensing a difference in potential between two global read bit lines GRBL1 and GRBL2. This example can easily be applied to a one-cell-one-bit structure.

Furthermore, in the foregoing embodiments, the memory cell MC and reference cell RC include, for example, a select transistor serving as an N-channel FET. This select transistor can be changed to a P-channel FET.

(Application Example)

The resistance change memory according to each of the above-described embodiments can be applied to, for example, a cache memory of a low power consumption processor.

FIG. 34 illustrates an example of a memory in a processor.

A CPU 31 controls an SRAM 32, a DRAM 33, a flash memory 34, a ROM 35 and a magnetic random access memory (MRAM) 36.

The MRAM 36 can be used as an alternative to each of the SRAM 32, DRAM 33, flash memory 34 and ROM 35. Accordingly, at least one of the SRAM 32, DRAM 33, flash memory 34 and ROM 35 can be excluded.

The MRAM 36 can also be used as a nonvolatile cache (for example, an L2 cache).

FIG. 35 illustrates a basic structure of a magnetoresistive element.

A magnetoresistive element MTJ is an example of the resistance change elements in the foregoing embodiments. The magnetoresistive element MTJ has a stacked structure in which a storage layer (ferromagnetic layer) 1 with perpendicular and variable magnetization, a tunnel barrier layer (insulation layer) 2 and a reference layer (ferromagnetic layer) 3 with perpendicular and invariable magnetization are stacked one on another in the direction perpendicular to the film surface (perpendicular direction).

The invariable magnetization means that the direction of magnetization does not vary before and after a write operation, whereas the variable magnetization means that the direction of magnetization can vary in the opposite direction before and after a write operation.

The write operation means spin-transfer write in which spin torque is applied to magnetization of the storage layer 1 by causing spin-transfer current (spin-polarized electrons) to flow into the magnetoresistive element MTJ.

For example, when spin-transfer current is caused to flow from the storage layer 1 to the reference layer 3, the electrons that are spin-polarized in the same direction as that of magnetization of the reference layer 3 are injected into the storage layer 1, and spin torque is applied to the magnetization of the storage layer 1, with the result that the direction of magnetization of the storage layer 1 becomes equal to that of the reference layer 3 (parallel state).

When the spin-transfer current is caused to flow from the reference layer 3 to the storage layer 1, the electrons that are spin-polarized in the direction opposite to that of the magnetization of the reference layer 3, which are included in the electrons from the storage layer 1 to the reference layer 3, are returned into the storage layer 1, and spin torque is applied to the magnetization of the storage layer 1, with the result that the direction of magnetization of the storage layer 1 becomes opposite to that of the reference layer 3 (antiparallel state).

Because of the magnetoresistive, the resistance of the magnetoresistive element MTJ varies with the direction of magnetization relative to the reference layer 3 and the storage layer 1. Specifically, the resistance of the magnetoresistive element MTJ becomes small in the parallel state and large in the antiparallel state. If the resistance in the parallel state is R0 and that in the antiparallel state is R1, the magnetoresistance (MR) is equal to (R1−R0)/R0.

In this example, the magnetization of the reference layer 3 is fixed toward the storage layer 1; however, it can be fixed opposite to the storage layer 1. When the magnetoresistive element MTJ is formed on a semiconductor substrate, the reference layer 3 can be arranged above the storage layer 1, and vice versa.

For example, when the reference layer 3 is arranged above the storage layer 1, the magnetoresistive element MTJ is called a top pin type, and when the reference layer 3 is arranged under the storage layer 1, the magnetoresistive element MTJ is called a bottom pin type.

FIG. 36 illustrates an example of a magnetoresistive element having a shift cancelation layer.

A magnetoresistive element MTJ has a stacked structure in which a storage layer (ferromagnetic layer) 1 with perpendicular and variable magnetization, a tunnel barrier layer (insulation layer) 2 and a reference layer (ferromagnetic layer) 3 with perpendicular and invariable magnetization are stacked one on another in the direction perpendicular to the film surface.

The magnetoresistive element MTJ includes a shift cancelation layer (ferromagnetic layer) 4 with perpendicular and invariable magnetization opposite to the reference layer 3. A nonmagnetic layer (for example, a metal layer) 5 is interposed between the reference layer 3 and the shift cancelation layer 4.

In this example, the reference layer 3 and the storage layer 1 has perpendicular magnetization. In this case, a stray magnetic field from the reference layer 3 is directed toward the magnetization direction (perpendicular direction) of the storage layer 1 and thus a stray magnetic field having a large perpendicular component is applied to the storage layer 1. This stray magnetic field acts in a direction in which the magnetization direction of the storage layer 1 is made equal to that of the reference layer 3 (parallel state).

Therefore, the RH curve of the storage layer 1 shifted.

To change the magnetoresistive element MTJ from the antiparallel state to the parallel state, a small spin-transfer current has only to flow into the magnetoresistive element MTJ. To change the magnetoresistive element MTJ from the parallel state to the antiparallel state, a large spin-transfer current has to flow into the magnetoresistive element MTJ.

The antiparallel state becomes unstable because of a stray magnetic field from the reference layer 3.

More specifically, when the stray magnetic field is larger than the coercive force of the storage layer 1, the storage layer 1 cannot hold the antiparallel state. Even though the stray magnetic field is smaller than the coercive force of the storage layer 1, if a fluctuation in magnetization due to thermal agitation is taken into consideration, the magnetization of the storage layer 1 may be inverted from the antiparallel state to the parallel state by the stray magnetic field.

The shift cancelation layer 4 is provided to resolve the above-described problem.

In this example, the reference layer 3 and the shift cancelation layer 4 are stacked one on the other. In this case, the direction of magnetization of the shift cancelation layer 4 is set to a direction opposite to that of the reference layer 3. In the storage layer 1, therefore, the stray magnetic field from the reference layer 3 is canceled by a cancelation magnetic field from the shift cancelation layer 4, with the result that a shift in the RH curve of the storage layer 1 can be canceled.

CONCLUSION

According to the embodiments described above, a semiconductor memory capable of a high-speed read operation can be achieved even though read current is decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a first block array including first to n-th blocks (n is a natural number of 2 or more) arranged in a first direction, each of the first to n-th blocks including a first memory cell;
   a first conductive line extending in the first direction, and shared by the first to n-th blocks;
   first to n-th current amplifiers corresponding to the first to n-th blocks, the i-th current amplifier (i is one of 1 to n) including an input terminal and an output terminal, the input terminal of the i-th current amplifier being electrically connected to the first memory cell in the i-th block, the output terminal of the i-th current amplifier being electrically connected to the first conductive line; and
   a sense amplifier electrically connected to the first conductive line.

2. The memory of claim 1, further comprising:
   first to n-th driver pairs corresponding to the first to n-th blocks, and driven by a first potential and a second potential smaller than the first potential,
   the first memory cell in the i-th block is connected between the i-th driver pair in a writing, and the i-th driver pair generates a current having a current direction corresponding to data written to the first memory cell in the i-th block.

3. The memory of claim 2, wherein
   the first to n-th current amplifiers are driven by a third potential smaller than the first potential, the first memory cell in the i-th block is connected between one of drivers in the i-th driver pair and the i-th current amplifier in a reading, and the one of the drivers in the i-th driver pair outputs one of the first and second potentials.

4. The memory of claim 3, wherein
   the other of the drivers in the i-th driver pair is inactive in the reading.

5. The memory of claim 3, wherein
   the one of the drivers in the i-th driver pair outputs the first potential and a current flows from the sense amplifier toward the i-th current amplifier, in the reading.

6. The memory of claim 3, wherein
the one of the drivers in the i-th driver pair outputs the second potential and a current flows from the i-th current amplifier toward the sense amplifier, in the reading.

7. The memory of claim 2, further comprising:
a control circuit disposed out of the first block array, and controlling operations of the first to n-th driver pairs.

8. The memory of claim 1, wherein
the first memory cell includes a resistance change element.

9. The memory of claim 1, wherein
the first memory cell includes a magnetoresistive element.

10. The memory of claim 1, further comprising:
a second conductive line extending in the first direction, and shared by the first to n-th blocks; and
(n+1)-th to 2n-th current amplifiers corresponding to the first to n-th blocks, each of the first to n-th blocks including a reference cell, the j-th current amplifier (j is one of n+1 to 2n) including an input terminal and an output terminal, the input terminal of the j-th current amplifier being electrically connected to the reference cell in the j-th block, the output terminal of the j-th current amplifier being electrically connected to the second conductive line, the sense amplifier being electrically connected to the second conductive line.

11. The memory of claim 10, wherein
load capacities of the first and second conductive lines are substantially equal.

12. The memory of claim 1, further comprising:
a second conductive line extending in the first direction, and shared by the first to n-th blocks; and
(n+1)-th to 2n-th current amplifiers corresponding to the first to n-th blocks, each of the first to n-th blocks including a second memory cell, the j-th current amplifier (j is one of n+1 to 2n) including an input terminal and an output terminal, the input terminal of the j-th current amplifier being electrically connected to the second memory cell in the j-th block, the output terminal of the j-th current amplifier being electrically connected to the second conductive line, the sense amplifier being electrically connected to the second conductive line.

13. The memory of claim 12, wherein
load capacities of the first and second conductive lines are substantially equal.

14. The memory of claim 1, further comprising:
a second block array including (n+1)-th to 2n-th blocks arranged in the first direction, each of the (n+1)-th to 2n-th blocks including a second memory cell;
a second conductive line extending in the first direction, and shared by the (n+1)-th to 2n-th blocks; and
(n+1)-th to 2n-th current amplifiers corresponding to the (n+1)-th to 2n-th blocks, the j-th current amplifier (j is one of n+1 to 2n) including an input terminal and an output terminal, the input terminal of the j-th current amplifier being electrically connected to the second memory cell in the j-th block, the output terminal of the j-th current amplifier being electrically connected to the second conductive line, the sense amplifier being electrically connected to the second conductive line.

15. The memory of claim 14, wherein
load capacities of the first and second conductive lines are substantially equal.

16. The memory of claim 1, wherein
the sense amplifier is connected to one end of the first conductive line.

* * * * *